(12) United States Patent
Kikuchi et al.

(10) Patent No.: US 6,528,343 B1
(45) Date of Patent: Mar. 4, 2003

(54) SEMICONDUCTOR DEVICE ITS MANUFACTURING METHOD AND ELECTRONIC DEVICE

(75) Inventors: Hiroshi Kikuchi, Hidaka (JP); Yoshiyuki Kado, Ome (JP); Ikuo Yoshida, Musashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/646,711

(22) PCT Filed: May 12, 2000

(86) PCT No.: PCT/JP00/03068

§ 371 (c)(1),
(2), (4) Date: Nov. 29, 2000

(87) PCT Pub. No.: WO00/70670

PCT Pub. Date: Nov. 23, 2000

(30) Foreign Application Priority Data

May 12, 1999 (JP) ............................................ 11-131324

(51) Int. Cl.[7] ..................... H01L 21/44; H01L 21/4763; H01L 29/48
(52) U.S. Cl. ...................... 438/106; 438/108; 438/118; 438/119; 438/612; 438/613; 438/614; 438/615; 257/778; 257/783; 257/785; 257/734; 257/784; 257/782; 257/758; 257/773
(58) Field of Search ................................. 438/106, 108, 438/118, 119, 612–617; 257/778, 783, 785, 734, 784, 782, 758, 773

(56) References Cited

U.S. PATENT DOCUMENTS

| 4,955,132 A | * | 9/1990 | Ozawa ........................ 29/840 |
| 5,120,665 A | * | 6/1992 | Tsukagoshi et al. .......... 156/64 |
| 5,136,365 A | * | 8/1992 | Pennisi et al. ................ 148/24 |
| 5,587,337 A | | 12/1996 | Idaka et al. ................. 437/183 |
| 5,737,191 A | * | 4/1998 | Horiuchi et al. ............ 361/764 |
| 6,016,013 A | * | 1/2000 | Baba ...................... 228/180.22 |
| 6,064,114 A | * | 5/2000 | Higgins, III ................ 257/698 |
| 6,147,311 A | * | 11/2000 | Higashi ....................... 174/255 |
| 2001/0002163 A1 | * | 5/2001 | Imasu et al. ................. 361/783 |

FOREIGN PATENT DOCUMENTS

| JP | 3-85642 | | 8/1991 |
| JP | 4-30542 | | 2/1992 |
| JP | 5-218042 | | 8/1993 |
| JP | 8-115949 | * | 5/1996 |
| JP | 9-22912 | | 1/1997 |
| JP | 9-199535 | | 7/1997 |
| JP | 9-321181 | | 12/1997 |
| JP | 10-27827 | * | 1/1998 |
| JP | 11-111885 | * | 4/1999 |

* cited by examiner

*Primary Examiner*—David E. Graybill
*Assistant Examiner*—James Mitchell
(74) *Attorney, Agent, or Firm*—Miles & Stockbridge P.C.

(57) ABSTRACT

Disclosed herein is a semiconductor device, which comprises a semiconductor chip including, over one main surface thereof, first wirings, protective films formed so as to cover other portions excluding parts of the first wirings, flexible layers respectively formed on the protective films so as to exclude the parts of the first wirings, and second wirings having first portions respectively electrically connected to the parts of the first wirings, and second portions respectively drawn onto the flexible layers; a wiring board having third wirings over one main surface thereof; and an adhesive comprising a large number of conductive particles contained in an insulative resin, and wherein the semiconductor chip is bonded to the wiring board with the adhesive interposed therebetween in a state in which the one main surface thereof is face to face with the one main surface of the wiring board, and the second portions of the second wirings are respectively electrically connected to the third wirings with some of the large number of conductive particles interposed therebetween.

19 Claims, 18 Drawing Sheets

SEMICONDUCTOR DEVICE ITS MANUFACTURING METHOD AND ELECTRONIC DEVICE

TECHNICAL FIELD

The present invention relates to a technology effective for application to a mounting technology for implementing a semiconductor chip on a wiring board with an adhesive obtained by mixing a large number of conductive particles into an insulative resin interposed therebetween.

BACKGROUND ART

As a mounting technology for implementing a semiconductor chip on a printed circuit board or a wiring board by a face down bonding system, a mounting technology (hereinafter called "bumpless mounting technology") has been developed which eliminates for the need of conductive bumps and makes use of an anisotropic conductive resin (e.g., ACF: Anisotropic Conductive Film) obtained by mixing a large number of conductive particles into an insulative resin. Since the semiconductor chip is contact-bonded to the wiring board with the anisotropic conductive resin interposed therebetween to thereby make it possible to bond and fix the semiconductor chip to the wiring board and electrically connect both by conductive particles interposed between wires on the wiring board and electrode pads (bonding pads) on the semiconductor chip, the present bumpless mounting technology allows the production of a semiconductor device and an electronic device both reduced in thickness and low in cost as compared with a flip chip mounting technology using bumps.

Incidentally, the bumpless mounting technology has been described in, for example, Japanese Published Unexamined Patent Application No. Hei 8-115949.

However, the bumpless mounting technology brings about the following problems.

The semiconductor chip principally comprises a semiconductor substrate, a multilayer wiring layer obtained by stacking an insulating layer and a wiring layer on a circuit forming surface of the semiconductor substrate in plural stages, and protective films (final protective films) formed so as to cover the multilayer wiring layer. The electrode pads of the semiconductor chip are formed on a wiring layer corresponding to the top layer in the multilayer wiring layer and exposed from bonding openings defined in the protective films. Namely, since the electrode pads of the semiconductor chip are provided at position below the protective films, the conductive particles are sandwiched between the wires on the wiring board and the protective films on the semiconductor chip when the conductive particles are interposed between the wires of the wiring board and the electrode pads of the semiconductor chip to obtain continuity between the two.

On the other hand, since the protective films of the semiconductor chip are normally formed of an insulating film such as a silicon oxide film, a silicon nitride film or the like to prevent the entry of impurities such as Na ions, etc. and moisture, these insulating films are hard and brittle. Therefore, cracks are developed in the protective films of the semiconductor chip with portions between which the conductive particles are interposed, as the starting points. Since the impurities such as the Na ions, and the moisture are easy to enter inside the protective films when the cracks occur in the protective films of the semiconductor chip, the semiconductor device and the electronic device are reduced in reliability.

An object of the present invention is to provide a technology which allows conductive particles to prevent cracks developed in protective films on a semiconductor chip.

Another object of the present invention is to achieve the above object and provide a semiconductor device and an electronic device each of which has a high degree of reliability and is thinned and low in cost.

The above, other objects and novel features of the present invention will become apparent from the description of the present specification and the accompanying drawings.

DISCLOSURE OF THE INVENTION

Summaries of typical ones of the inventions disclosed in the present application will be described in brief as follows:

(1) There is provided a semiconductor device comprising a semiconductor chip including, over one main surface thereof, first wires, protective films formed so as to cover other portions excluding parts of the first wires, flexible layers respectively formed on the protective films so as to exclude the parts of the first wires, and second wires having first portions respectively electrically connected to the parts of the first wires, and second portions respectively drawn onto the flexible layers; a wiring board having third wires over one main surface thereof; and an adhesive comprising a large number of conductive particles contained in an insulative resin, and wherein the semiconductor chip is bonded to the wiring board with the adhesive interposed therebetween in a state in which the one main surface thereof is face to face with the one main surface of the wiring board, and the second portions of the second wires are respectively electrically connected to the third wires with some of the large number of conductive particles interposed therebetween.

(2) There is also provided a semiconductor device, comprising a semiconductor chip including, over one main surface thereof, first wires, and protective films formed so as to cover other portions excluding parts of the first wires; a wiring board including, over one main surface thereof, second wires, flexible layers formed so as to cover other portions excluding parts of the second wires, and third wires having first portions respectively electrically connected to the parts of the second wires, and second portions respectively drawn onto the flexible layers; and an adhesive comprising a large number of conductive particles contained in an insulative substance, and wherein the semiconductor chip is bonded to the wiring board with the adhesive interposed therebetween in a state in which the one main surface thereof is face to face with the one main surface of the wiring board, and the parts of the first wires are respectively electrically connected to the second portions of the third wires with some of the large number of conductive particles interposed therebetween.

(3) There is further provided an electronic device comprising a semiconductor chip including, over one main surface thereof, first wires, protective films formed so as to cover other portions excluding parts of the first wires, flexible layers respectively formed on the protective films so as to exclude the parts of the first wires, and second wires having first portions respectively electrically connected to the parts of the first wires, and second portions respectively drawn onto the flexible layers; a wiring board having third wires over one main surface thereof; and an adhesive comprising a large number of conductive particles contained in an insulative resin, and wherein the semiconductor chip is bonded to the wiring board with the adhesive interposed therebetween in a state in which the one main surface thereof is face to face with the one main surface of the wiring board, and the second portions of the second wires are respectively electrically connected to the third wires with some of the large number of conductive particles interposed therebetween.

(4) There is still further provided an electronic device comprising a semiconductor chip including, over one main surface thereof, first wires, and protective films formed so as to cover other portions excluding parts of the first wires; a wiring board including, over one main surface thereof, second wires, flexible layers formed so as to cover other portions excluding parts of the second wires, and third wires having first portions respectively electrically connected to the parts of the second wires, and second portions respectively drawn onto the flexible layers; and an adhesive comprising a large number of conductive particles contained in an insulating resin, and wherein the semiconductor chip is bonded to the wiring board with the adhesive interposed therebetween in a state in which the one main surface thereof is face to face with the one main surface of the wiring board, and the parts of the first wires are respectively electrically connected to the second portions of the third wires with some of the large number of conductive particles interposed therebetween.

BEST MODE FOR CARRYING OUT THE INVENTION

Figure 1:
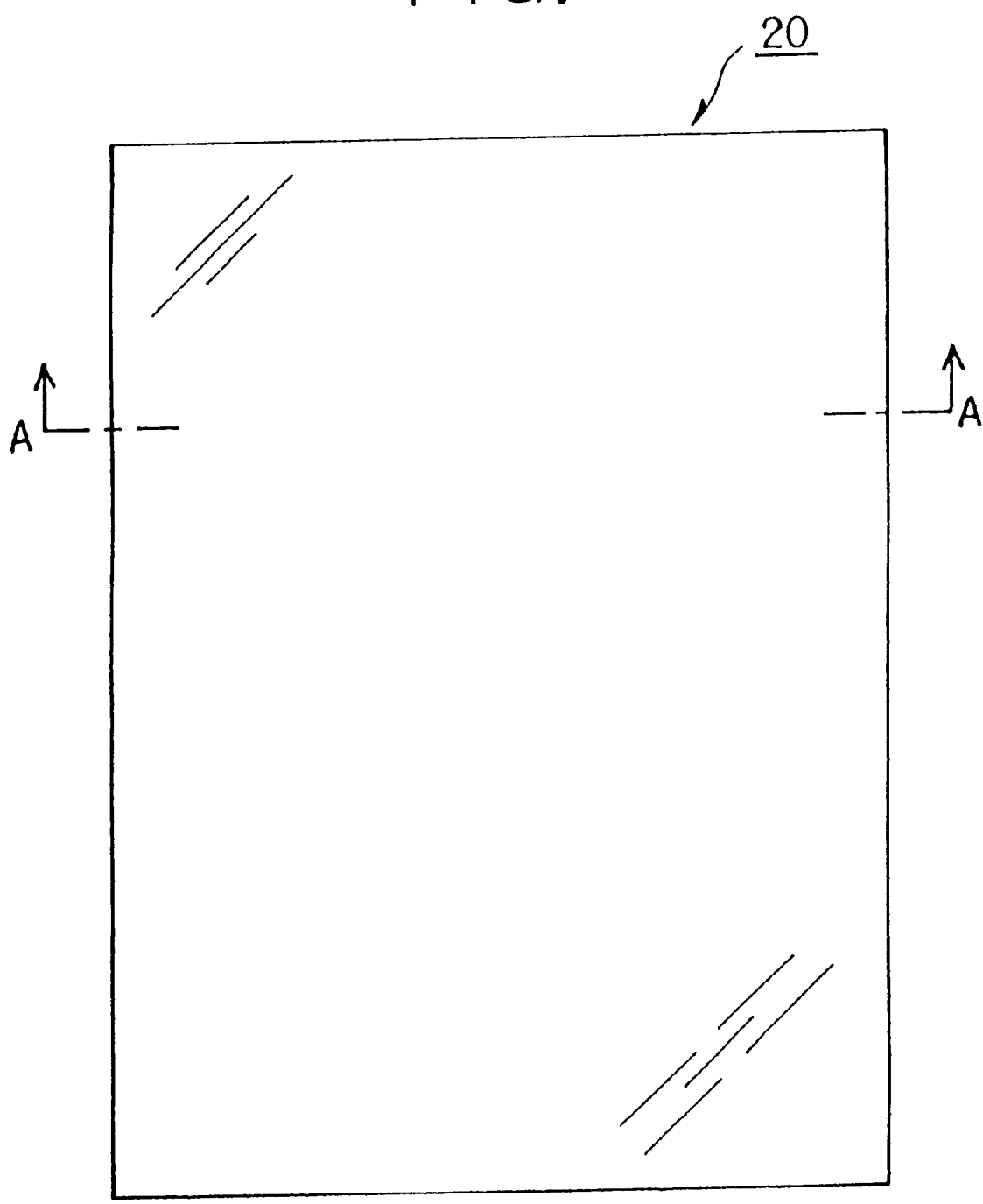
FIG. 1 is a typical plan view of a semiconductor device showing an embodiment 1 of the present invention.

Best mode for carrying out the invention will hereinafter be described in detail with reference to the accompanying drawings. Components or those each having the same function in all the drawings for describing the embodiments of the present invention are identified by the same reference numerals and their repetitive description will therefore be omitted.

Embodiment 1

In the present embodiment, a description will be made of an example in which the present invention is applied to a CSP (Chip Size Package) type semiconductor device.

Figure 2:
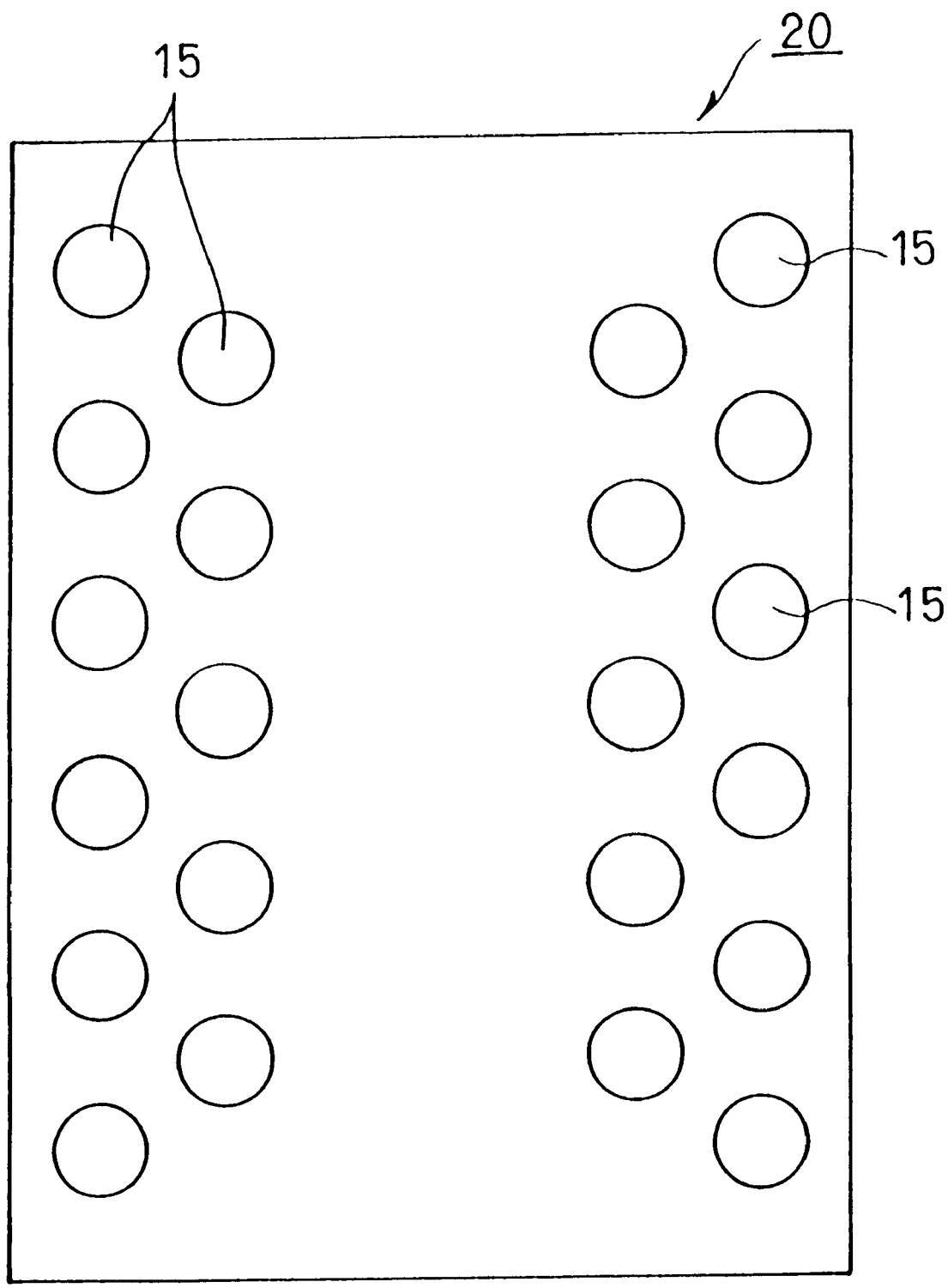
FIG. 2 is a typical bottom view of the semiconductor device showing the embodiment 1 of the present invention.
Figure 3:
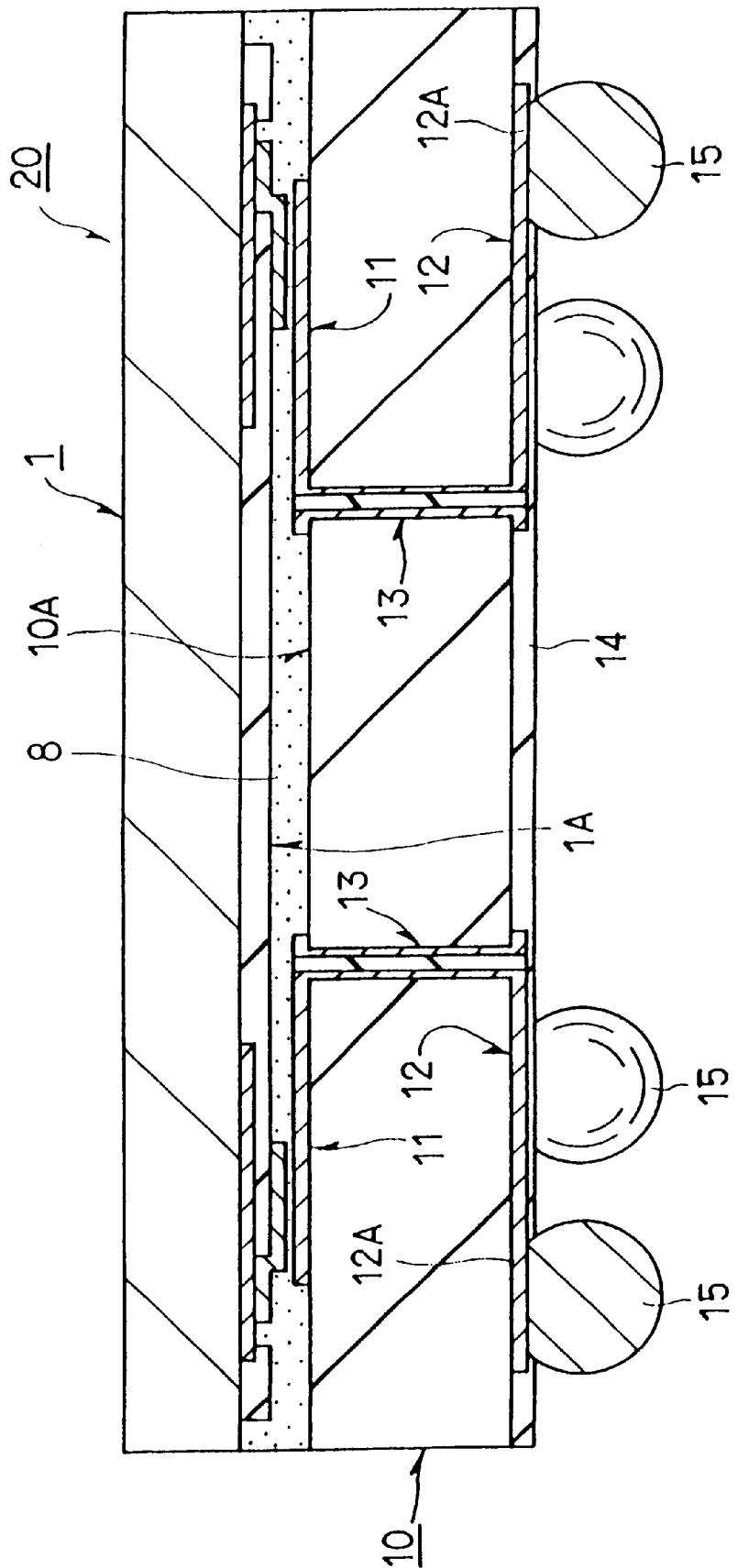
FIG. 3 is a typical cross-sectional view taken along line A—A of FIG. 1.
Figure 4:
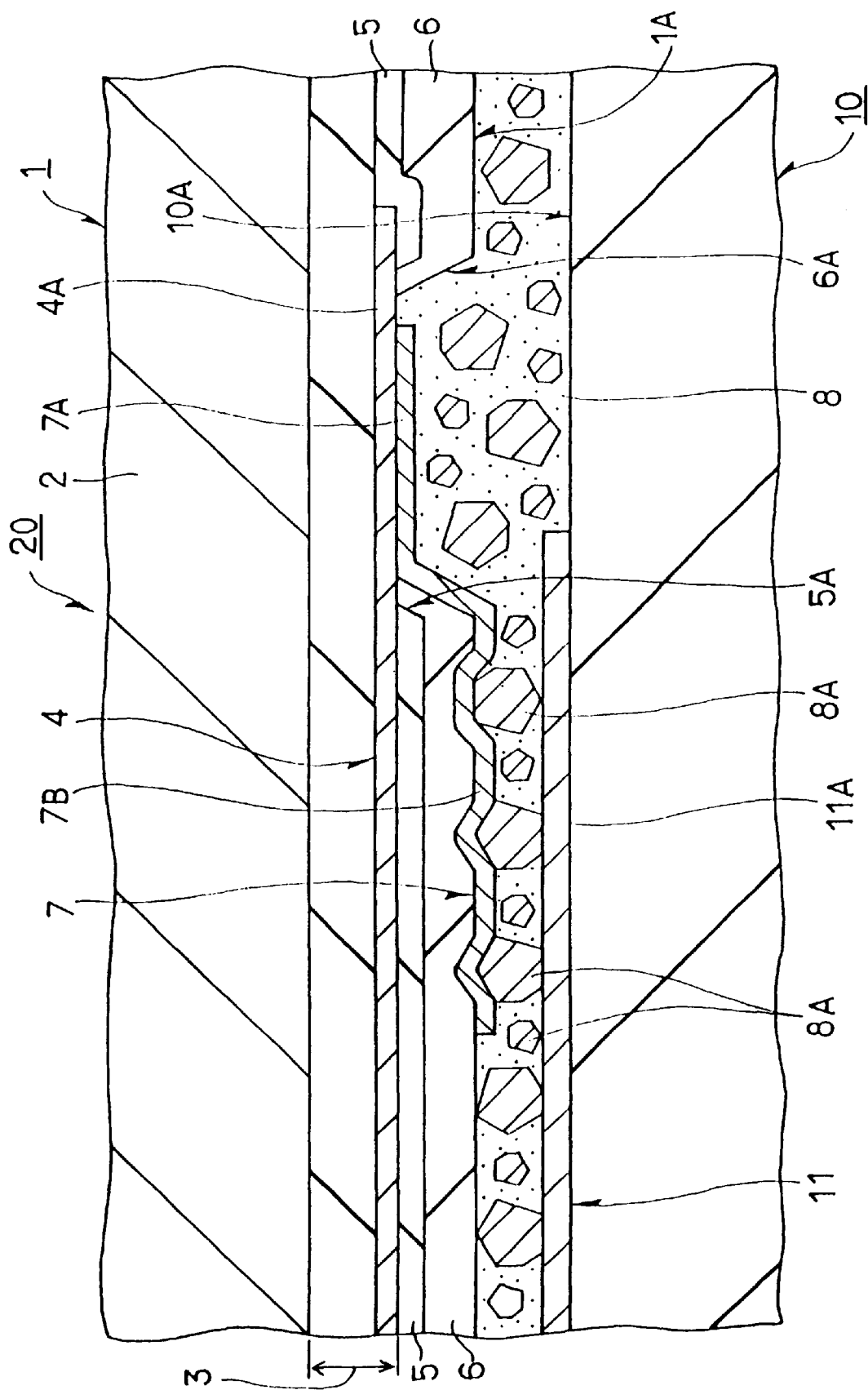
FIG. 4 is a typical cross-sectional view showing a part of FIG. 3 in enlarged form.
Figure 5:
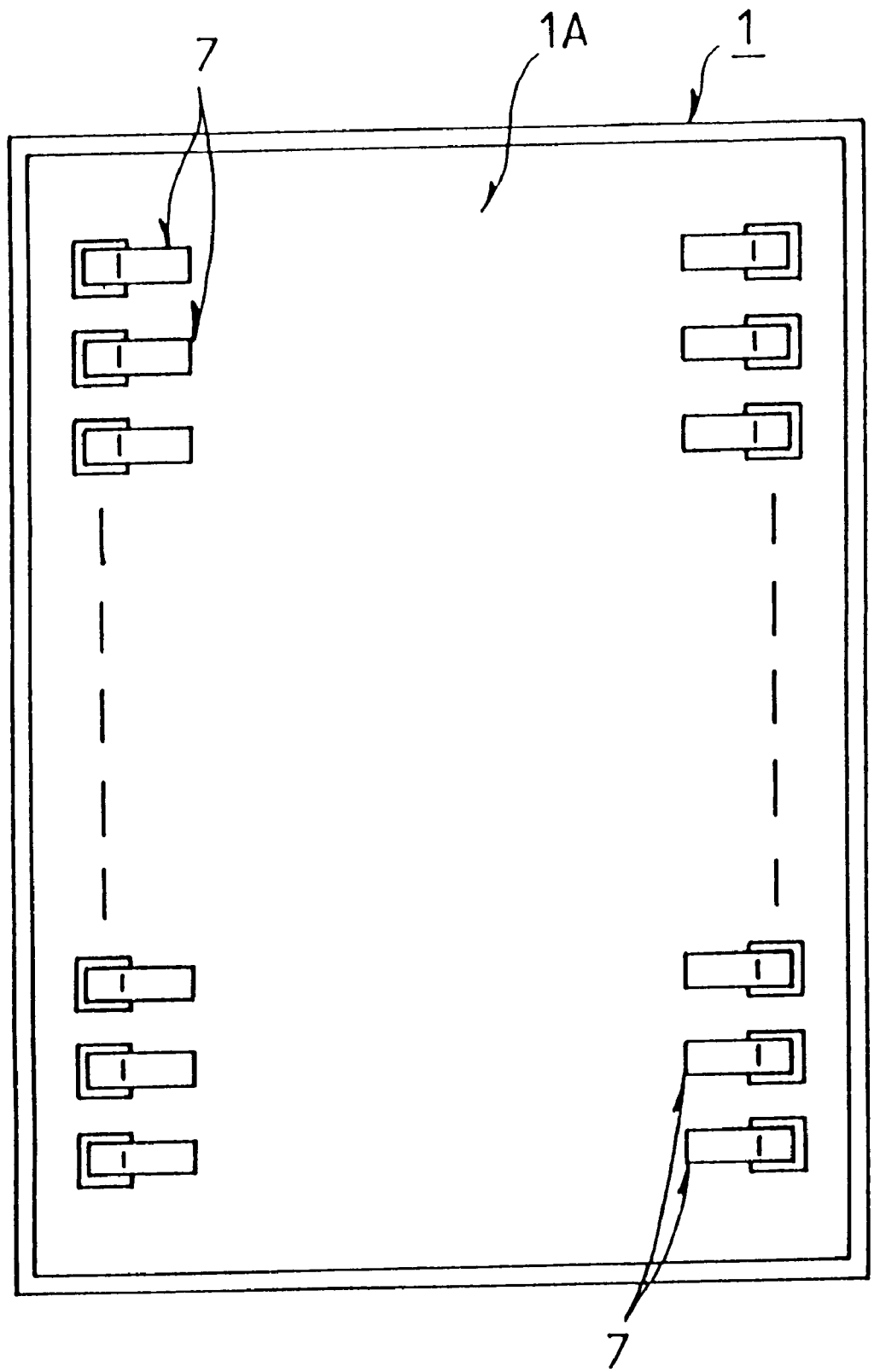
FIG. 5 is a typical plan view of a semiconductor chip shown in FIG. 3.
Figure 6:
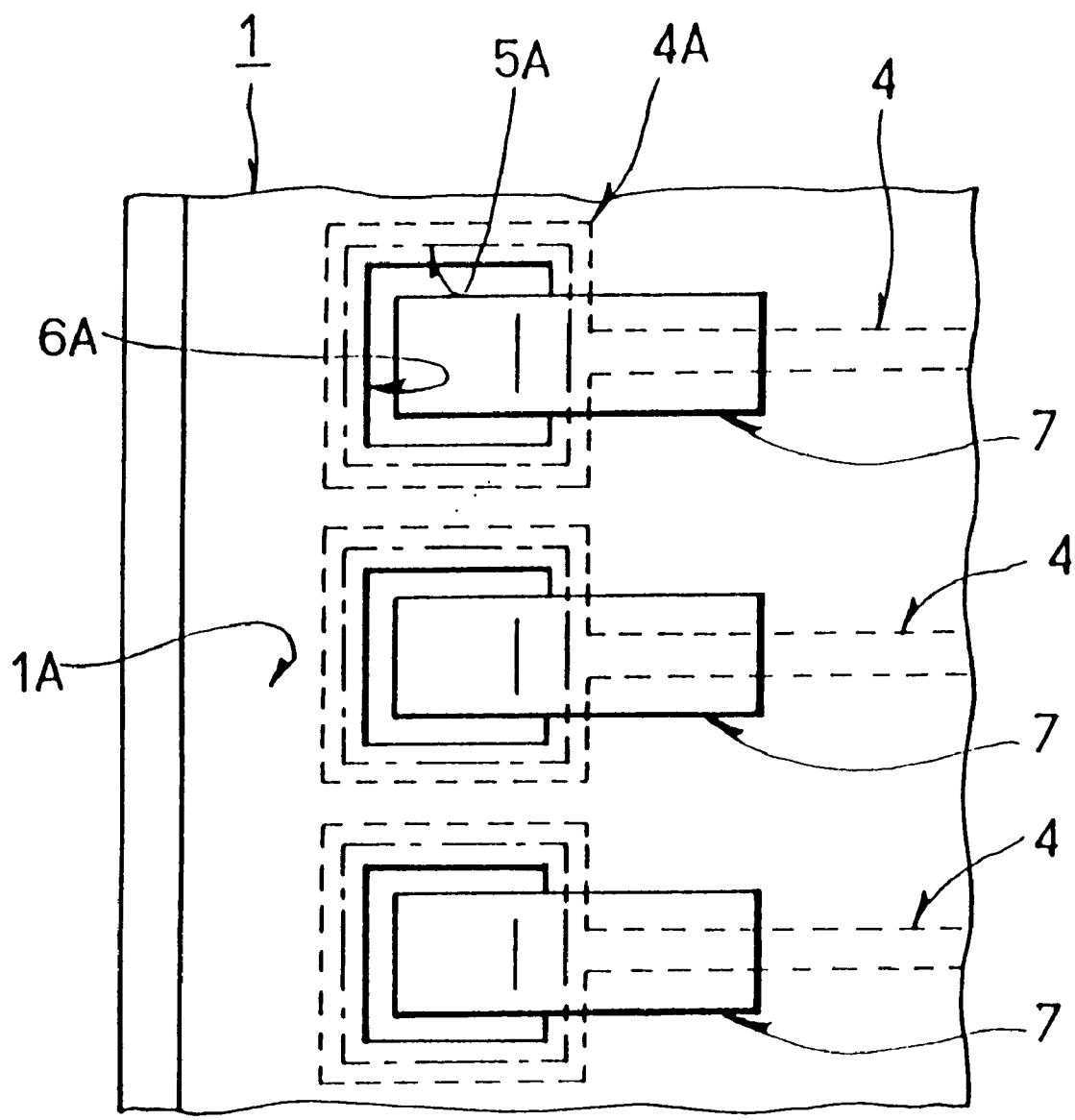
FIG. 6 is a typical plan view showing a part of FIG. 5 in enlarge form.
Figure 7:
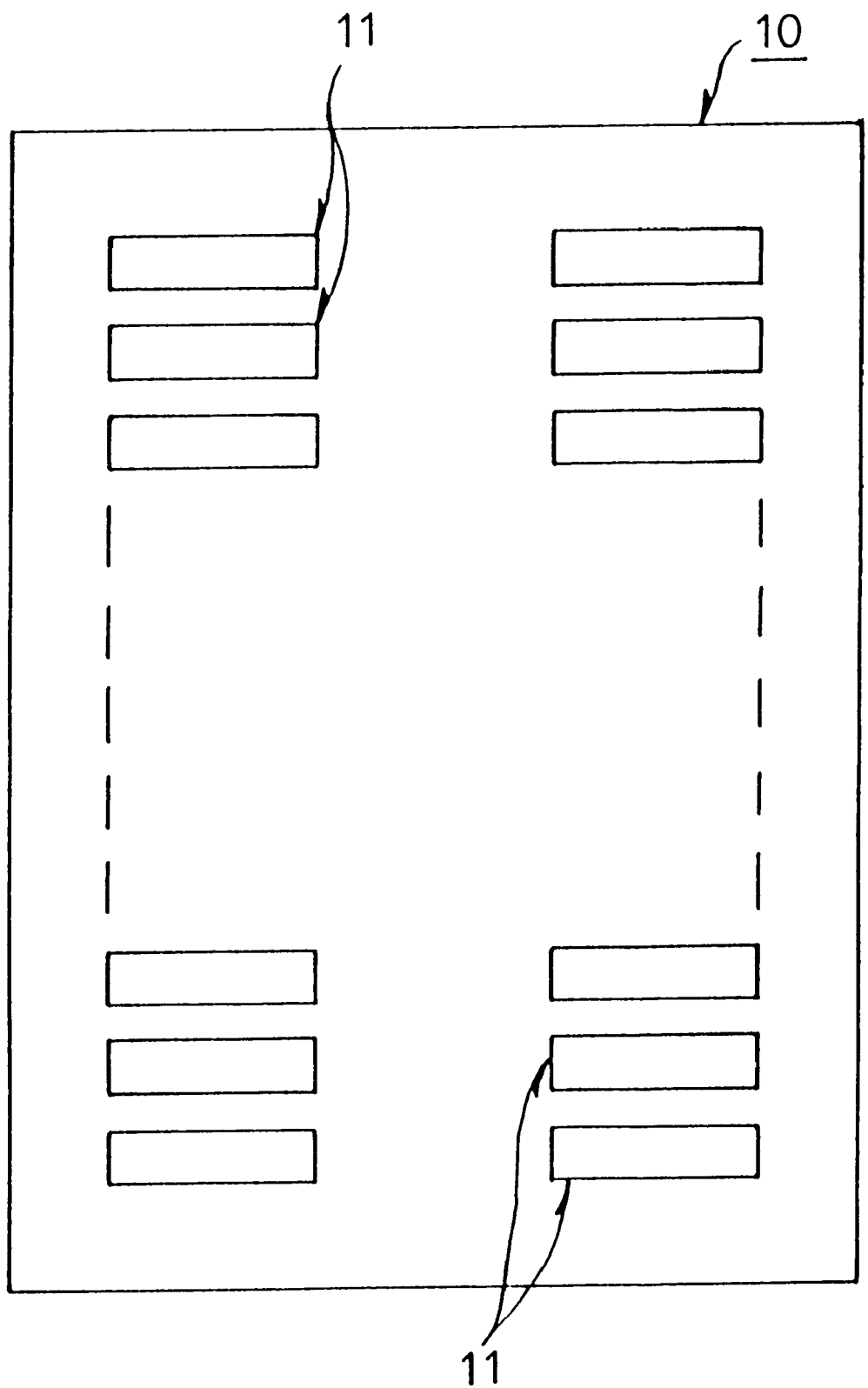
FIG. 7 is a typical plan view of a wiring board shown in FIG. 3.
Figure 8:
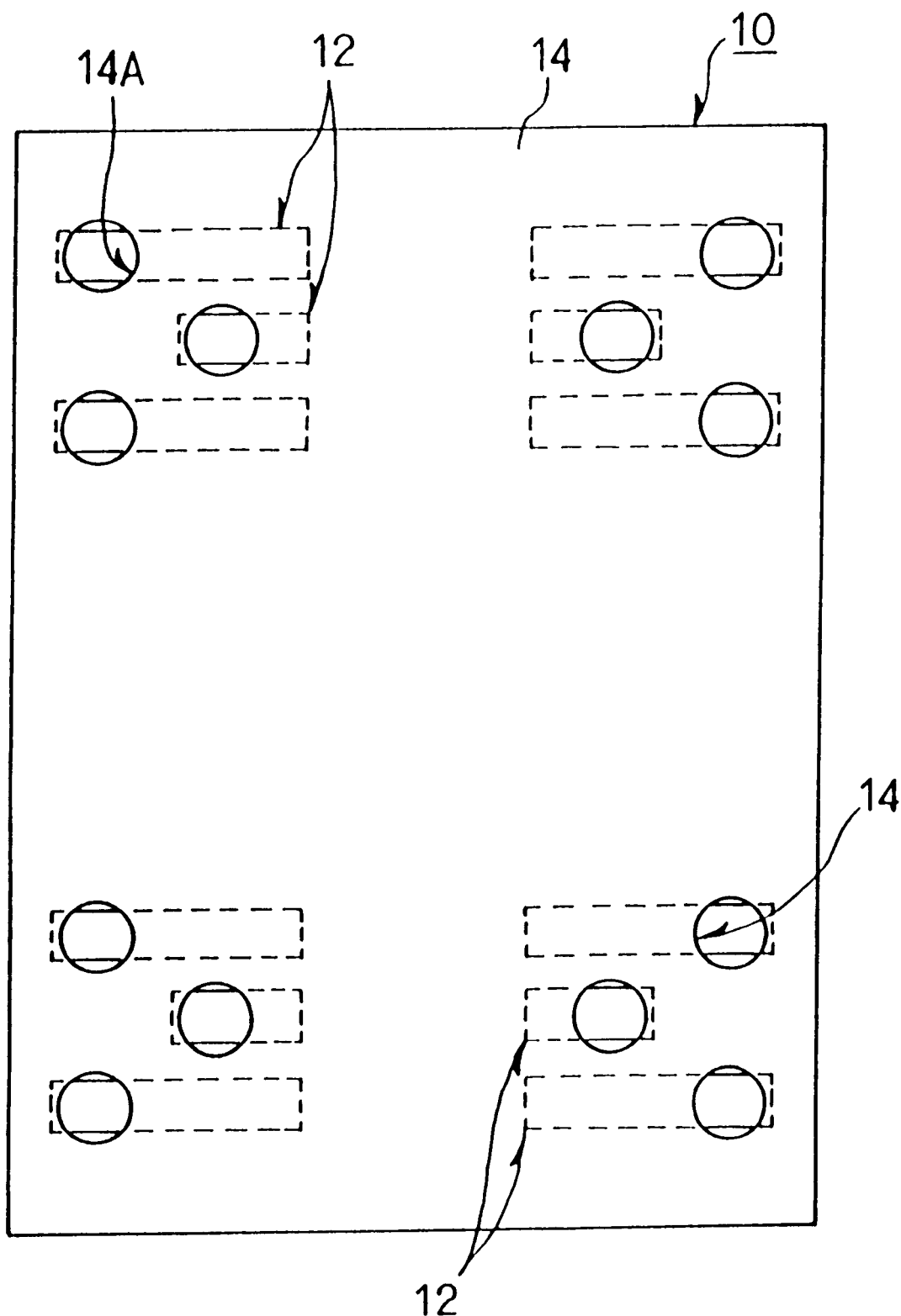
FIG. 8 is a typical bottom view of the wiring board shown in FIG.

FIG. 1 is a typical plan view of a CSP type semiconductor device showing the embodiment 1 of the present invention, FIG. 2 is a typical bottom view of the CSP type semiconductor device, FIG. 3 is a typical cross-sectional view taken along line A—A of FIG. 1, FIG. 4 is a typical cross-sectional view showing a part of FIG. 3 in developed form, FIG. 5 is a typical plan view of a semiconductor chip shown in FIG. 3, FIG. 6 is a typical plan view illustrating a part of FIG. 5 in developed form, FIG. 7 is a typical plan view of a wiring board shown in FIG. 3, and FIG. 8 is a typical bottom view of the wiring board shown in FIG. 3, respectively.

As shown in FIGS. 1 and 2, the CSP type semiconductor device 20 according to the present embodiment has a plane shaped in the form of a square. In the present embodiment, the plane thereof is shaped in the form of a rectangle of 15 [mm]×18 [mm], for example. As shown in FIG. 3, the semiconductor device 20 principally comprises a printed circuit board or a wiring board 10, a semiconductor chip 1 on the one main surface 10A side of one main surface and the other main surface of the wiring board 10, both of which are opposite to each other, and a plurality of bump electrodes 15 placed as external connecting terminals on the other main surface side of the wiring board 10. The semiconductor chip 1 is bonded and fixed to the wiring board 10 with an adhesive 8 interposed therebetween in a state in which one main surface (circuit forming surface) 1A of one main surface and the other main surface thereof both opposite to each other is face to face with one main surface 10A of the wiring board 10. As the adhesive 8, may be used an anisotropic conductive resin obtained by mixing, for example, an epoxy thermosetting resin (insulative resin) with a large number of conductive particles (e.g., nickel (Ni) particles) 8A (see FIG. 4).

Each of the semiconductor chip 1 and the wiring board 10 is formed in the same plane size as that of the semiconductor device 20. For example, an SRAM (Static Random Access Memory) is built in the semiconductor chip 1 as a memory circuit.

As shown in FIG. 4, the semiconductor chip 1 principally comprises a semiconductor substrate 2, a multilayer wiring layer 3 obtained by stacking an insulating layer and a wiring layer on a circuit forming surface used as one main surface of the semiconductor substrate 2 in plural stages, wirings 4 formed in the wiring layer corresponding to the top layer of the multilayer wiring layer 3, protective films 5 formed so as to cover other portions excluding electrode pads (bonding pads) 4A used as parts of the wirings 4, flexible layers 6 formed on the protective films 5 except for the electrode pads 4A, and wirings or interconnections 7 having first portions 7A respectively electrically connected to the electrode pads 4A and second portions 7B respectively drawn onto the flexible layers 6.

As shown in FIG. 4, the second portions 7B are deformed by some of the conductive particles 8A.

The semiconductor substrate 2 is formed of, for example, single-crystal silicon. The insulating layer of the multilayer wiring layer 3 is formed of, for example, a silicon oxide film, and the wiring layer of the multilayer wiring layer 3 is formed of, for example, an aluminum (Al) film. The protective film 5 is formed of, for example, a silicon nitride film to prevent the entry of impurities such as Na ions, etc. and moisture. The flexible layer 6 is formed of an insulative material more flexible than the protective film 5, e.g., a polyimide resin. The wiring 7 is formed of a conductive material more flexible than the protective film 5, e.g., copper (Cu) or a copper alloy film.

The wirings 4 with the electrode pads 4A formed as their parts are provided in plural form. Thus, the wirings 7 are provided in plural form in association with the number of the wirings 4. The plurality of wirings 7 are divided into two wiring groups as shown in FIG. 5. The respective wirings 7 included in one wiring group are placed on the side of one long side of the mutually-opposed two sides of the semiconductor chip 1 along one long side thereof. The respective wirings 7 included in the other wiring group are placed on the side of the other long side thereof along the other long side. The wirings 7 included in one wiring group are drawn along the other long side of the semiconductor chip 1, whereas the wirings 7 included in the other wiring group are drawn along one long side of the semiconductor chip 1.

As shown in FIGS. 4 and 6, the first portions of the wirings 7 are electrically connected to their corresponding electrode pads 4A through openings 5A defined in the protective films 5 so as to expose the electrode pads 4A and openings 6A defined in the flexible layers 6 so as to overlap with the openings 5A. A plane form of each electrode pad 4A is shaped in the form of a square, for example, and the width thereof is wider than each of wiring portions corresponding to other portions of the wirings 4. In the present embodiment, the electrode pad 4A is formed with a width of about 50 [μm], for example, and each wiring portion is formed with a width of about 30 [μm], for example.

Plane forms of the openings 5A and 6A are respectively shaped in the form of a square, for example. In the present embodiment, the opening 5A is formed with a width of about 45 [μm], for example, and the opening 6A is shaped with a width of about 40 [μm], for example. Namely, the peripheral edge of each opening 5A is covered with the protective film 5, and the open end of the opening 6A is located inside the open end of the opening 5A.

The wiring board 10 is formed of a resin substrate obtained by impregnating, for example, a glass fiber with an epoxy resin or a polyimide resin. As shown in FIGS. 3 and 7, a plurality of wirings or interconnections 11 are formed over one main surface of the wiring board 10. The plurality of wirings 11 are divided into two wiring groups. The respective wirings 11 included in one wiring group are laid out on the side of one long side of the mutually-opposed two long sides of the wiring board 10 along one long side. The respective wirings 11 included in the other wiring group are placed on the side of the other long side thereof along the other long side. The respective wirings 11 included in one wiring group extend toward the other long side of the wiring board 10, whereas the respective wirings 11 included in the other wiring group extend toward one long side of the wiring board 10.

As shown in FIGS. 3 and 8, a plurality of wirings 12 are formed over the other main surface (back) of the wiring board 10. The plurality of wirings 12 are divided into two wiring groups. The respective wirings 12 included in one wiring group are arranged on the side of one long side of the mutually-opposed two long sides of the wiring board 10 along one long side. The respective wirings 12 included in the other wiring group are arranged on the side of the other long side thereof along the other long side. The respective wirings 12 included in one wiring group extend toward the other long side of the wiring board 10, whereas the respective wirings 12 included in the other wiring group extend toward one long side of the wiring board 10.

As shown in FIG. 3, the plurality of wirings 11 are respectively electrically connected to the plurality of wirings 12 through through-hole wirings or interconnections 13 provided within the wiring board 10. Each of the wirings 11 and 12 is formed of a copper film, for example. Further, each of the wirings 11 and 12 is formed with a thickness of about 0.025 [mm] and a width of about 0.5 [mm], for example.

As shown in FIGS. 3 and 8, an insulating resin film 14 is formed on the other main surface side of the wiring board 10 so as to cover each of the plurality of wirings 11. Openings 14A for exposing parts of the wirings 11 are defined in the resin film 14.

A plurality of bump electrodes 15 placed as external connecting terminals on the other main surface side of the wiring board 10 are respectively electrically and mechanically connected to respective parts of the plurality of wirings 12. Each of the plurality of bump electrodes 15 is formed of a metal member having the composition of 37 [wt %] lead (Pb)—63 [wt %] tin (Sn), for example.

The respective bump electrodes 15 are not limited to the above but placed on the sides of the opposed two long sides of the wiring board 10 in two rows along the respective long sides. The bump electrodes 15 of the respective rows are placed in array pitches wider than those of the electrode pads 4A.

As shown in FIG. 4, the second portions 7B of the wirings 7 are electrically connected to their corresponding connecting portions 11A of the wirings 11 on the wiring board 10 through some 8A of the large number of conductive particles 8A mixed into the adhesive 8. Namely, the semiconductor chip 1 is implemented on the wiring board 10 by the bumpless mounting technology.

Figure 9:
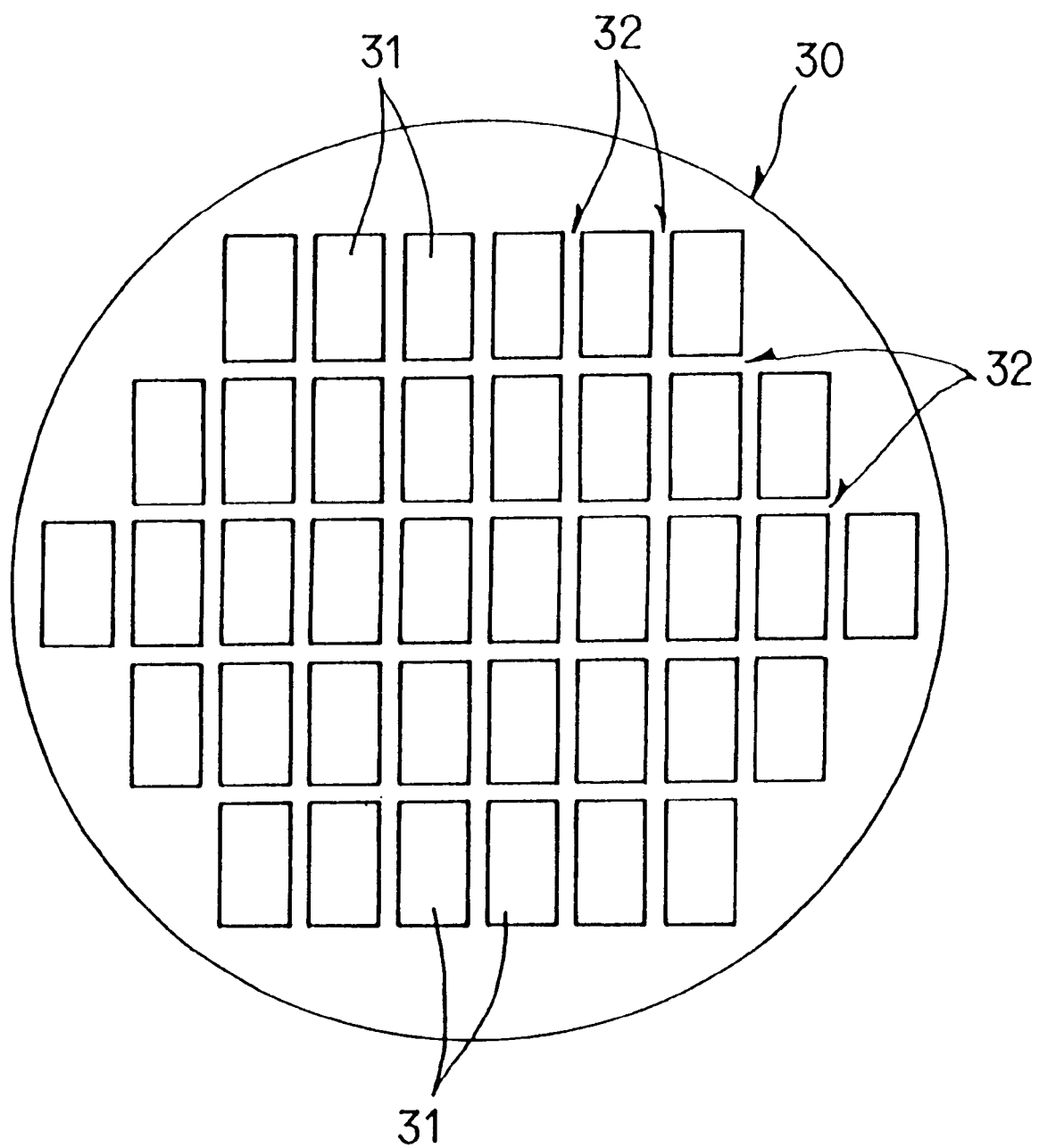
FIG. 9 is a plan view of a semiconductor wafer used for manufacturing the semiconductor device showing the embodiment 1 of the present invention.
Figure 10:
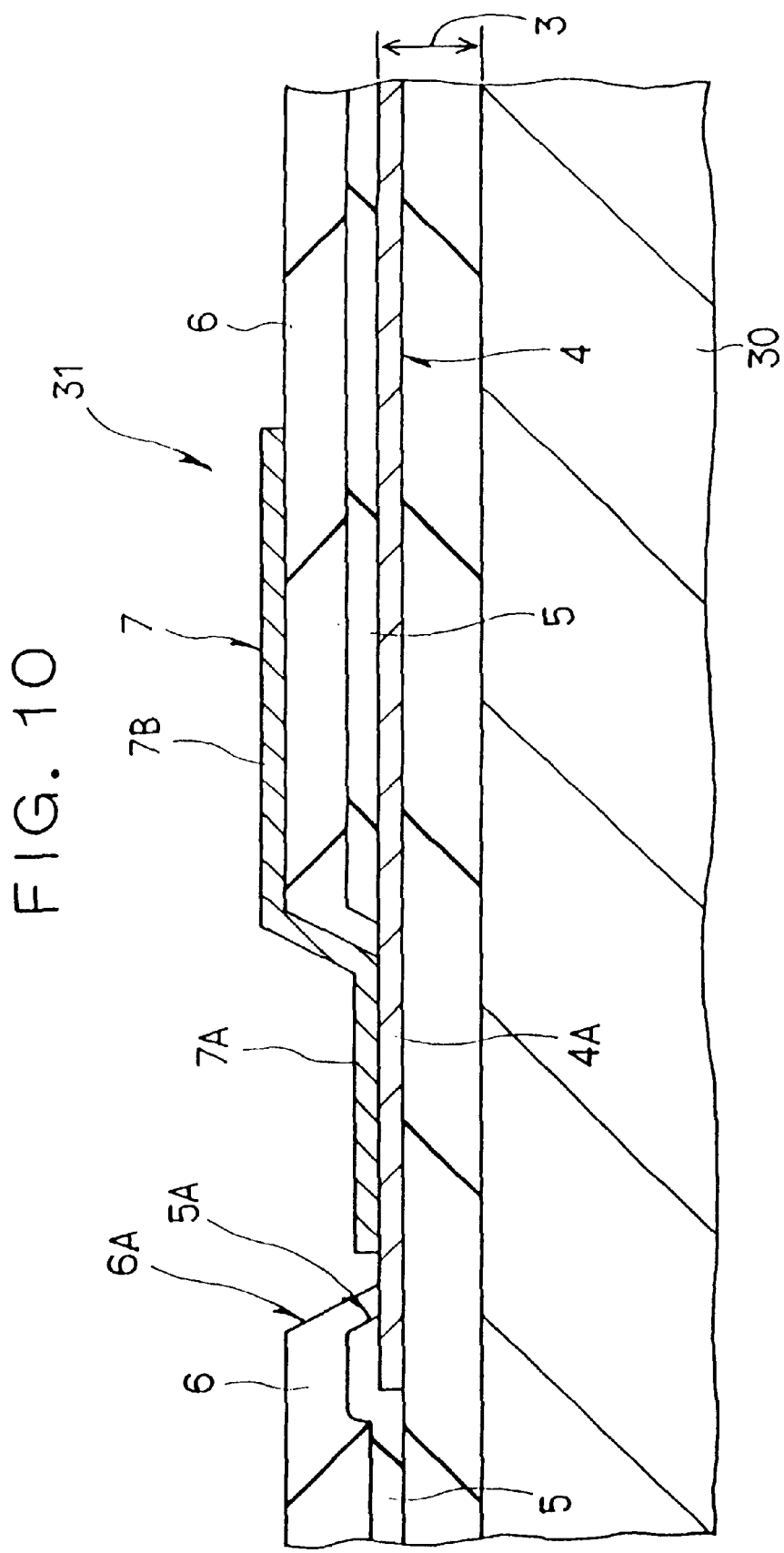
FIG. 10 is a typical cross-sectional view of the semiconductor wafer shown in FIG. 9.
Figure 11:
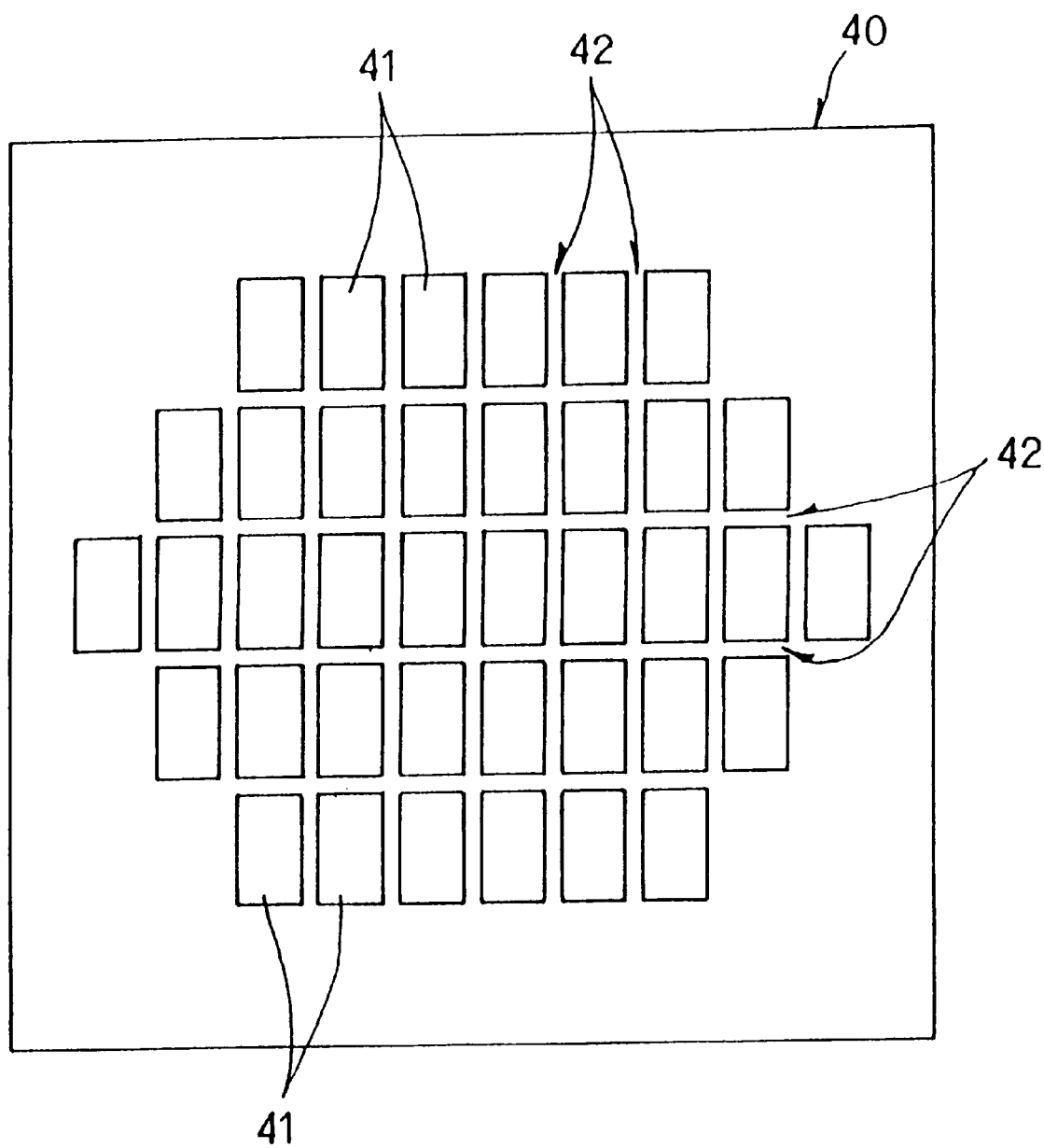
FIG. 11 is a plan view of a plate member used for manufacturing the semiconductor device showing the embodiment 1 of the present invention.
Figure 12:
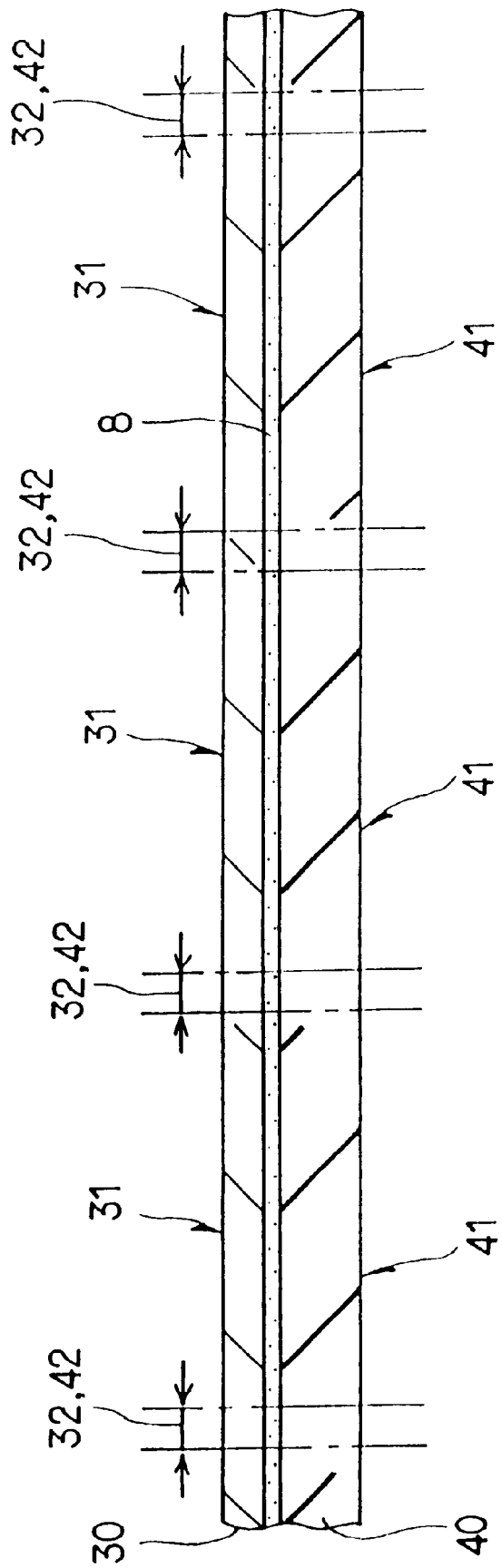
FIG. 12 a typical cross-sectional view showing a state in which the semiconductor wafer and the plate member are bonded and fixed to each other upon manufacture of the semiconductor device showing the embodiment 1 of the present invention.
Figure 13:
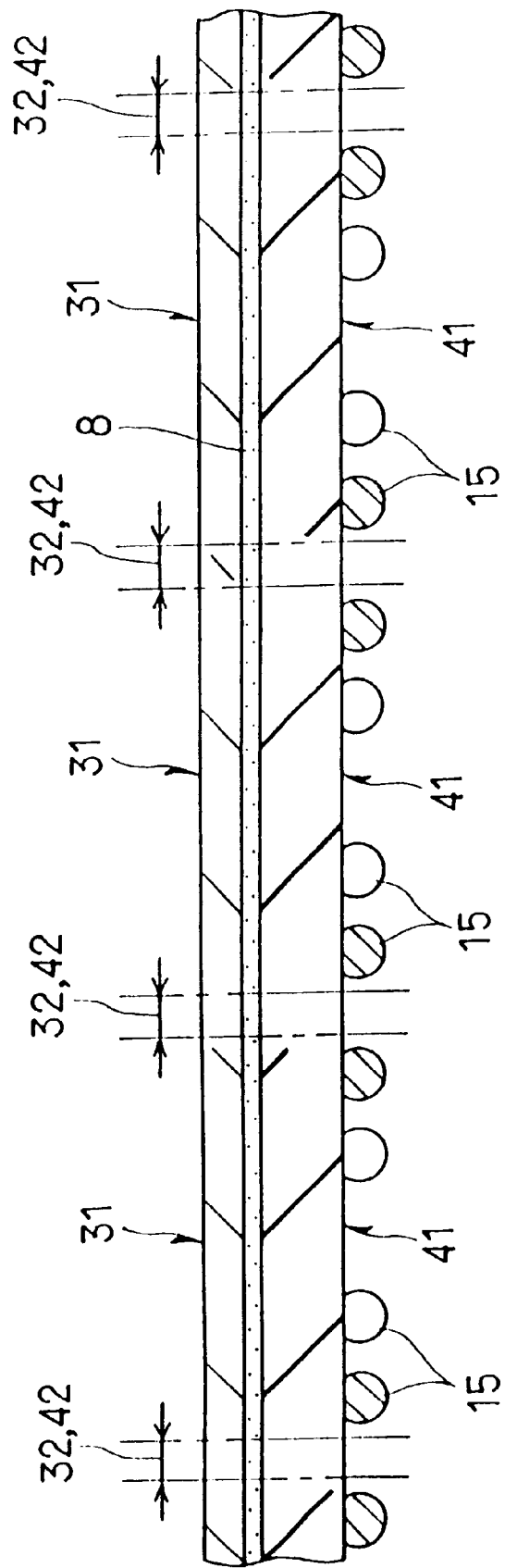
FIG. 13 is a typical cross-sectional view illustrating a state in which bump electrodes are formed upon manufacture of the semiconductor device showing the embodiment 1 of the present invention.
Figure 14:
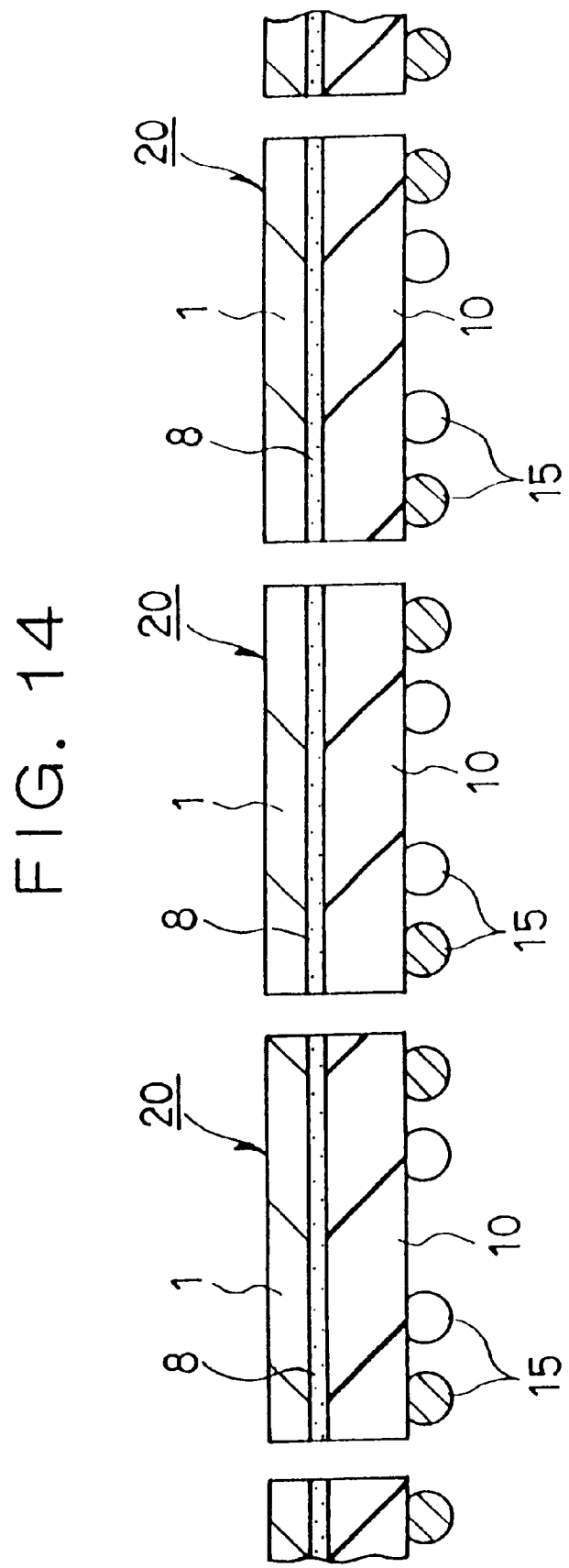
FIG. 14 is a typical cross-sectional view depicting a state of execution of a dicing process upon manufacture of the semiconductor device showing the embodiment 1 of the present invention.

A method of manufacturing the semiconductor device 20 will next be explained with reference to FIGS. 9 through 14. FIG. 9 is a typical plan view of a semiconductor wafer used for manufacturing the semiconductor device, FIG. 10 is a typical cross-sectional view showing a part of FIG. 9 in developed form, FIG. 11 is a plan view of a plate member used for manufacturing the semiconductor device, FIG. 12 is a typical cross-sectional view illustrating a state in which the semiconductor wafer and the plate member are bonded and fixed to each other, FIG. 13 is a typical cross-sectional view showing a state in which bump electrodes are formed, and FIG. 14 is a typical cross-sectional view depicting a state of execution of a dicing process, respectively.

First of all, a semiconductor wafer (semiconductor substrate) 30 comprised of monocrystalline silicon having a thickness of about 720 [m], for example, is prepared as the semiconductor wafer.

Next, semiconductor elements, multilayer wiring layers 3 including wirings 4, protective films 5, openings 5A, flexible layers 6, openings 6A, wirings 7, etc. are formed on a circuit forming surface corresponding to one main surface of one main surface and the other main surface both opposite to each other, of the semiconductor wafer 30. A plurality of chip forming areas 31 incorporating therein SRAMs which are memory circuits substantially identical to each other, are formed in matrix form. The plurality of chip forming areas 31 are respectively placed in a mutually-spaced state with dicing areas (cutting areas) 32 for cutting the semiconductor wafer 30 being interposed therebetween. Process steps used up to now are shown in FIGS. 9 and 10.

Next, the other main surface (back) of the semiconductor wafer 30 is polished to thin the thickness thereof.

Next, a plate member 40 shown in FIG. 11 is prepared. A plurality of wiring board forming areas 41 are formed over the plate member 40. The respective wiring board forming areas 41 are respectively identical in structure to the wiring board shown in FIGS. 3, 7 and 8. The respective wiring board forming areas 41 are placed in a state of being spaced away from one another with dicing areas (cutting areas) 42 for cutting the plate member 40 interposed therebetween. The plurality of wiring board forming areas 41 are placed so as to correspond to the respective chip forming areas 31 of the semiconductor wafer 30 respectively.

Next, the circuit forming surface of the semiconductor wafer 30 and one main surface (corresponding to the formed surface of wirings 11) of the plate member 40 are kept face to face with each other and thermo-compressed in a state in which an adhesive 8 comprised of an anisotropic conductive resin obtained by mixing an epoxy thermosetting resin with a large number of conductive particles 8A, for example is interposed between these, whereby the semiconductor wafer 30 and the plate member 40 are bonded and fixed to each other, and the second portions 7B of the wirings 7 in the respective chip forming areas 31 are electrically connected to their corresponding connecting portions 11A of the wirings 11 in the respective wiring board forming areas 41 with some 8A of the large number of conductive particles 8A interposed therebetween. A sheet-like one may desirably be used as the adhesive 8 but a liquid one may be used.

Since the second portion 7B of each wiring 7 is drawn onto its corresponding flexible layer 6 as shown in FIG. 4 in the present process step, the distance between the protective film 5 of the semiconductor chip 1 and each wiring 11 on the wiring board 10 can be made broad by a portion equivalent to the thickness of the flexible layer 6 as shown in FIG. 4. Since the flexible layer 6 and the wiring 7 are formed of a flexible material, the conductive particles 8A can be interposed between the second portion of each wiring 7 and the connecting portion 11A of each wiring 11 so as to relax produced stress. Further, since the protective film 5 is covered with the flexible layer 6, no conductive particles 8A are brought into contact with the protective film 5.

Incidentally, the flexible layer 6 and the wiring 7 may preferably be formed of a material easily deformed by pressured applied upon compression or pressure bonding.

It is desirable to form the thickness of the flexible layer 6 so as to be thinner than the size of the largest conductive particle 8A of the large number of conductive particles 8A.

Namely, the respective materials are set so as to become flexible in order of the protective films 5 >conductive particles 8A >wirings (Cu) 11 >>wirings 7 formed on the flexible layers 6 in the present embodiment.

Next, bump electrodes 15 are formed on their corresponding parts of wirings 12 in the respective wiring board forming areas 41 on the side of the other main surface (corresponding to the surface on which the wirings are formed) opposite to one main surface of the plate member 40. Although not limited to these, the bump electrodes 15 are formed by supplying spherical solder materials to their corresponding parts of the wirings 12 by a ball supply method and thereafter melting the spherical solder materials by an infrared reflow method. Further, the bump electrodes 15 may be formed by printing soldering paste on parts of the wirings 12 by a screen printing method and thereafter melting the soldering paste by the infrared reflow method. Process steps used up to now are shown in FIG. 13.

Next, the dicing areas 32 of the semiconductor wafer 30 and the dicing areas 42 of the plate member 30 are simultaneously diced to divide the semiconductor wafer 30 and the plate member 40 every chip forming areas 31 and wiring board forming areas 41. Thus, a plurality of semiconductor devices 20 can be formed simultaneously as shown in FIG. 14.

Thus, according to the present embodiment, the following advantageous effects can be obtained.

(1) The semiconductor device 20 has the semiconductor chip 1 including, over one main surface 1A, the wirings 4, the protective films 5 formed so as to cover the wiring portions (other portions) excluding the electrode pads 4A (parts) of the wirings 4, the flexible layers 6 formed on the protective films 5 except for the electrode pads 4A of the wirings 4, and the wirings 7 having the first portions 7A respectively electrically connected to the electrode pads 4A of the wirings 4 and the second portions 7B drawn onto the flexible layers 6; the wiring board 10 having, over one main surface 10A, the wirings 11 and the adhesive 8 comprised of the large number of conductive particles 8A contained in the insulative resin. The semiconductor chip 1 is bonded to the wiring board 10 with the adhesive 8 interposed therebetween in a state in which one main surface 1A thereof is face to face with one main surface 10A of the wiring board 10. The second portion 7A of each wiring 7 is electrically connected to its corresponding connecting portion 11A of each wiring 11 with some 8A of the large number of conductive particles 8A interposed therebetween.

Owing to such a construction, the distance between the protective film 5 of the semiconductor chip 1 and each wiring 11 on the wiring board 10 can be broadened by the portion equivalent to the thickness of the flexible layer 6 because the second portion 7B of each wiring 7 is caused to lead out onto the flexible layer 6. Since the flexible layer 6 and each wiring 7 are respectively formed of the flexible material, the produced stress can be relaxed by interposing the conductive particles 8A between the second portions of the wirings 7 and the connecting portions 11A of the wirings 11. Further, since the protective film 5 is covered with its corresponding flexible layer 6, no conductive particles 8A are brought into contact with the protective films 5. As a result, the conductive particles 8A allow the prevention of cracks developed in the protective film 5 of the semiconductor chip 1.

Since the conductive particles 8A allow the prevention of the cracks developed in the protective film 5 of the semiconductor chip 1, the semiconductor device 20 having a high degree of reliability can be provided which is reduced in thickness and low in cost.

(2) Since the open end of each opening 6A defined in the flexible layer 6 so as to expose the electrode pad 4A of each wiring 4 is located inside the open end of each opening 5A defined in the protective film 5 so as to expose the electrode pad 4A of each wiring 4.

Owing to such a construction, cracks developed in the protective film 5 by the conductive particles 8A on each electrode pad 4A can be avoided because the protective film 5 at the peripheral portion of each electrode pad 4A is covered with the flexible layer 6.

(3) A method of manufacturing the semiconductor device 20 includes a step for preparing the semiconductor wafer 30 having the plurality of chip forming areas 31 formed over one main surface thereof, which have the wirings 4, the protective films 5 formed so as to cover other portions excluding the electrode pads 4A (parts) of the wirings 4, the flexible layers 6 respectively formed on the protective films 5 except for the electrode pads 4A of the wirings 4, and the wirings 7 having the first portions 7A respectively electrically connected to the electrode pads 4A of the wirings 4 and the second portions 7B respectively drawn onto the flexible layers 6, preparing the plate member 40 having the plurality of wiring board forming areas 41 formed over one main surface, which have the wirings 11, and preparing the adhesive 8 comprising the large number of conductive particles 8A contained in the insulative resin;

contact-bonding one main surface of the semiconductor wafer 30 and one main surface of the plate member 40 to each other with the adhesive 8 interposed therebetween, cementing the semiconductor wafer 30 and the plate member 40 to each other, and electrically connecting the electrode pads 4A of the wirings 4 in the respective chip forming areas 31 and the connecting portions 11A of the wirings 11 in the respective wiring board forming areas 10 with some of the large number of conductive particles 8 interposed therebetween; and a step for simultaneously dividing the semiconductor wafer 30 and the plate member 40 every chip forming areas 31 and wiring board forming areas 41.

Thus, a plurality of semiconductor devices 20 which has a high degree of reliability and are thinned and low in cost, can be manufactured simultaneously.

Embodiment 2

In the present embodiment, a description will be made of an example in which the present invention is applied to a BGA (Ball Grid Array) type semiconductor device.

Figure 15:
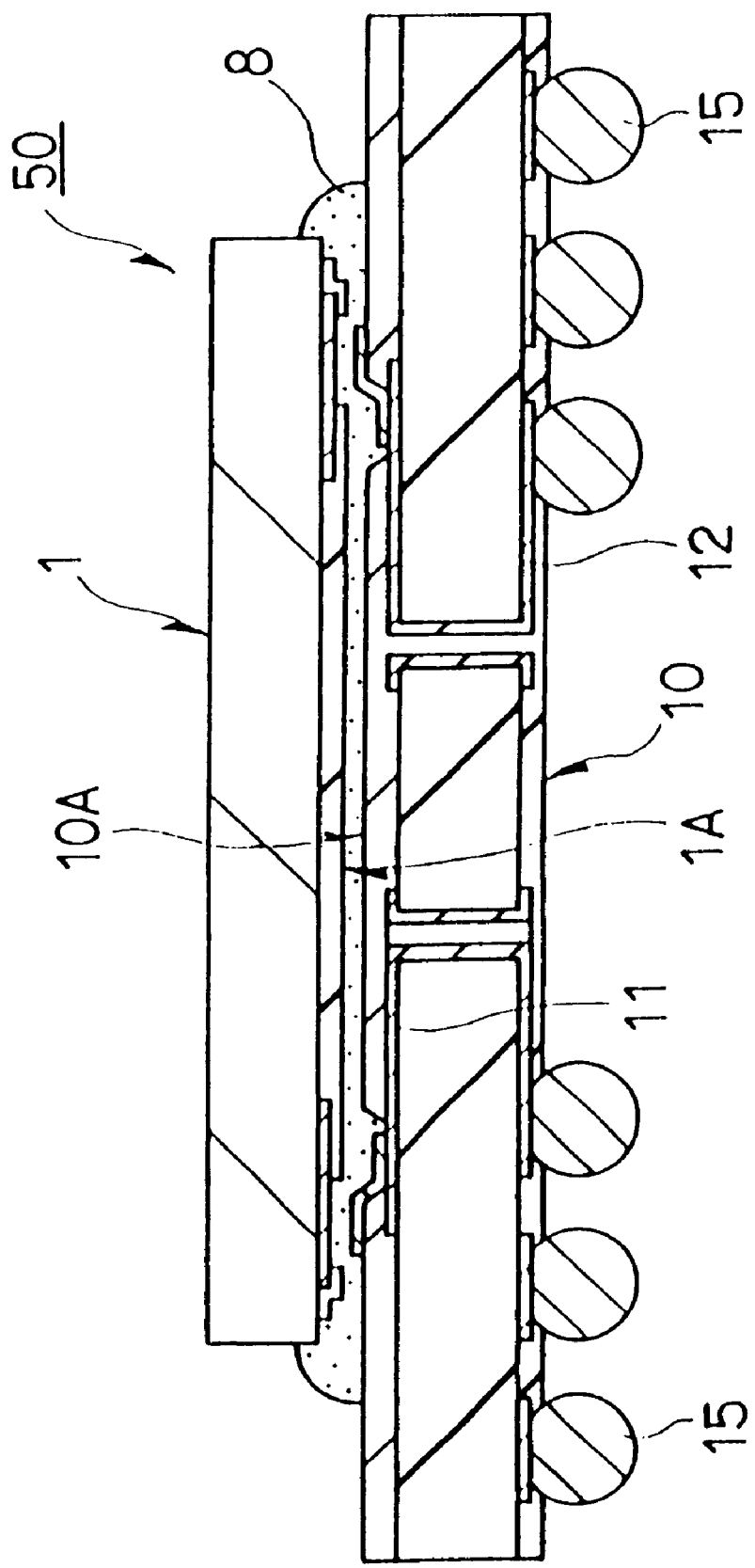
FIG. 15 is a typical cross-sectional view of a semiconductor device showing an embodiment 2 of the present invention.
Figure 16:
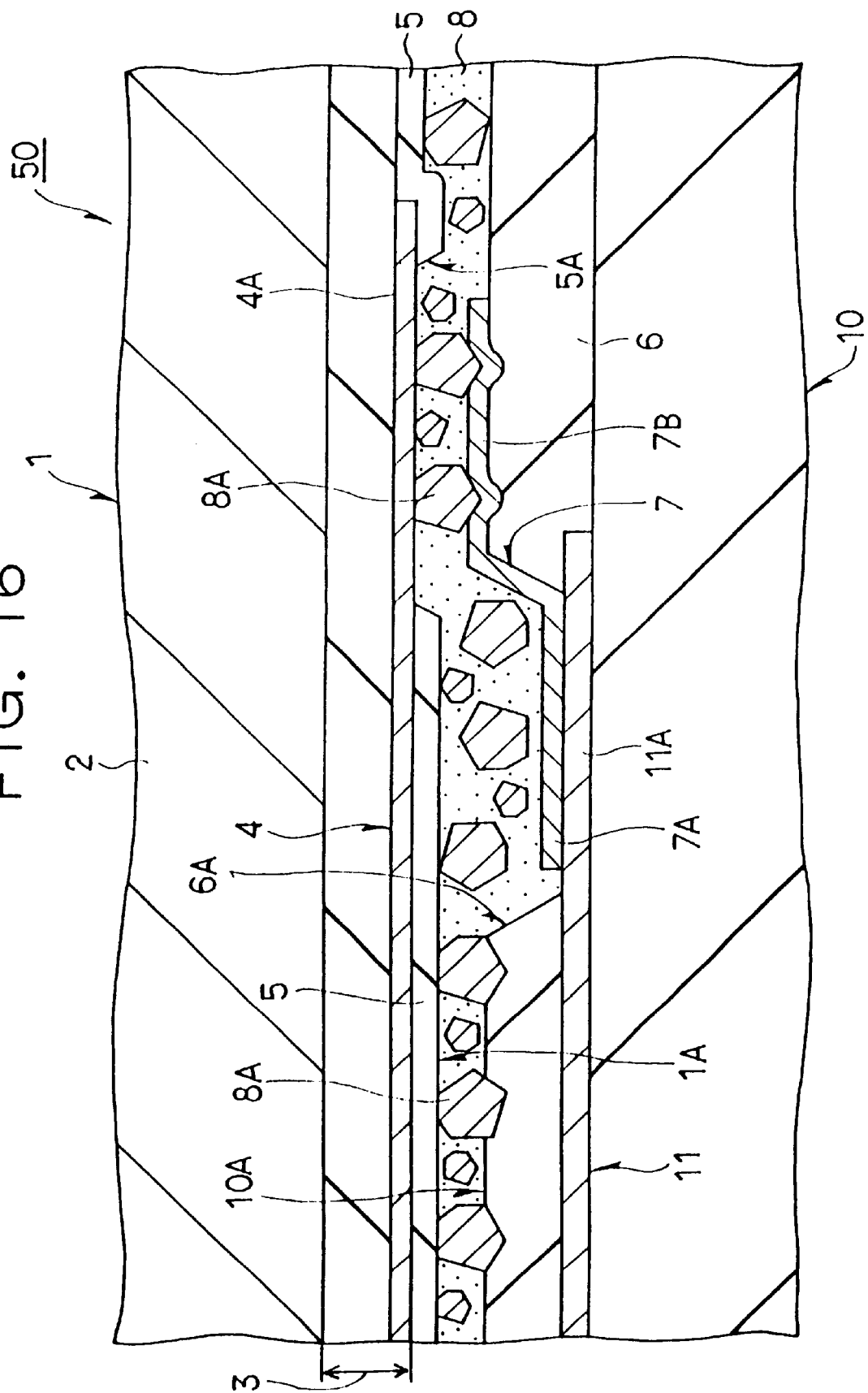
FIG. 16 is a typical cross-sectional view showing a part of FIG. 15 in enlarged form.

FIG. 15 is a typical cross-sectional view of the BGA type semiconductor device showing the embodiment 2 of the present invention, and FIG. 16 is a typical cross-sectional view illustrating a part of FIG. 15 in developed form, respectively.

As shown in FIGS. 15 and 16, the semiconductor device 50 according to the present embodiment is basically similar in configuration to the embodiment 1 but different from the embodiment 1 in the following structure.

Namely, flexible layers 6 and wirings 7 are formed over one main surface 10A of a wiring board 10. The flexible layer 6 is formed so as to cover a wiring portion (other portion) except for a connecting portion (part) 11A of each wiring 11 on the wiring board 10. A first portion 7A of each wiring 7 is electrically connected to its corresponding connecting portion 11A of each wiring 11 through an opening 6A defined in the flexible layer 6, whereas a second portion 7B of the wiring 7 is drawn onto the flexible layer 6.

As shown in FIG. 16, the second portions 7B are deformed by some of the conductive particles 8A.

Upon manufacture of the semiconductor device 50 according to the present embodiment, a semiconductor chip 1, the wiring board 10 and an adhesive 8 are first prepared. Next, a circuit forming surface 1A of the semiconductor chip 1 and one main surface 10A of the wiring board 10 are held face to face with each other and thermo-compressed in a state in which the adhesive (corresponding to an anisotropic conductive resin obtained by mixing an epoxy thermosetting resin with a large number of conductive particles 8A) 8 interposed between these, whereby the semiconductor chip 1 and the wiring board 10 are bonded and fixed to each other, and electrode pads 4A of wirings 4 on the semiconductor chip 1 and the second portions 7B of the wirings 7 thereon are electrically connected to one another with some 8A of the large number of conductive particles 8A interposed therebetween. Since the conductive particles 8A interposed between the protective film 5 and the flexible layer 6 on the semiconductor chip 1 are engaged in the flexible layer 6 in the present process step as shown in FIG. 16, the concentration of stress on the protective film 5 can be avoided. Owing to the present process step, the semiconductor device 50 is substantially completed.

Thus, the semiconductor device 50 has the semiconductor chip 1 including, over one main surface 1A, the wirings 4 and the protective films 5 formed so as to cover the wiring portions (other portions) excluding the electrode pads 4A (parts) of the wirings 4; the wiring board 10 having, over one main surface 10A, the wirings 11, the flexible layers 6 formed so as to cover the wiring portions (other portions) except for the connecting portions (parts) 11A of the wirings, and the wirings 7 having the first portions 7A respectively electrically connected to the connecting portions 11A of the wirings 11 and the second portions 7B drawn onto the flexible layers 6; and the adhesive 8 comprised of the large number of conductive particles 8A contained in the insulative substance. The semiconductor chip 1 is bonded to the wiring board 10 with the adhesive 8 interposed therebetween in a state in which one main surface 1A thereof is face to face with one main surface 10A of the wiring board 10. The electrode pads 4A of the wirings 4 are electrically connected to their corresponding second portions 7B of the wirings 7 with some 8A of the large number of conductive particles interposed therebetween.

Since the conductive particles 8A interposed between the protective film 5 and flexible layer 6 on the semiconductor chip 1 are engaged in the flexible layer 6 owing to such a construction, the concentration of stress on the protective film 5 can be avoided. As a result, the conductive particles 8A allow the prevention of cracks developed in the protective film 5 on the semiconductor chip 1.

Since the conductive particles 8A permit the prevention of the cracks developed in the protective film 5 on the semiconductor chip 1, it is possible to provide the semiconductor device 50 which has a high degree of reliability and is thinned and low in cost.

Embodiment 3

In the present embodiment, a description will be made of an example in which the present invention is applied to a memory module (electronic device).

Figure 17:
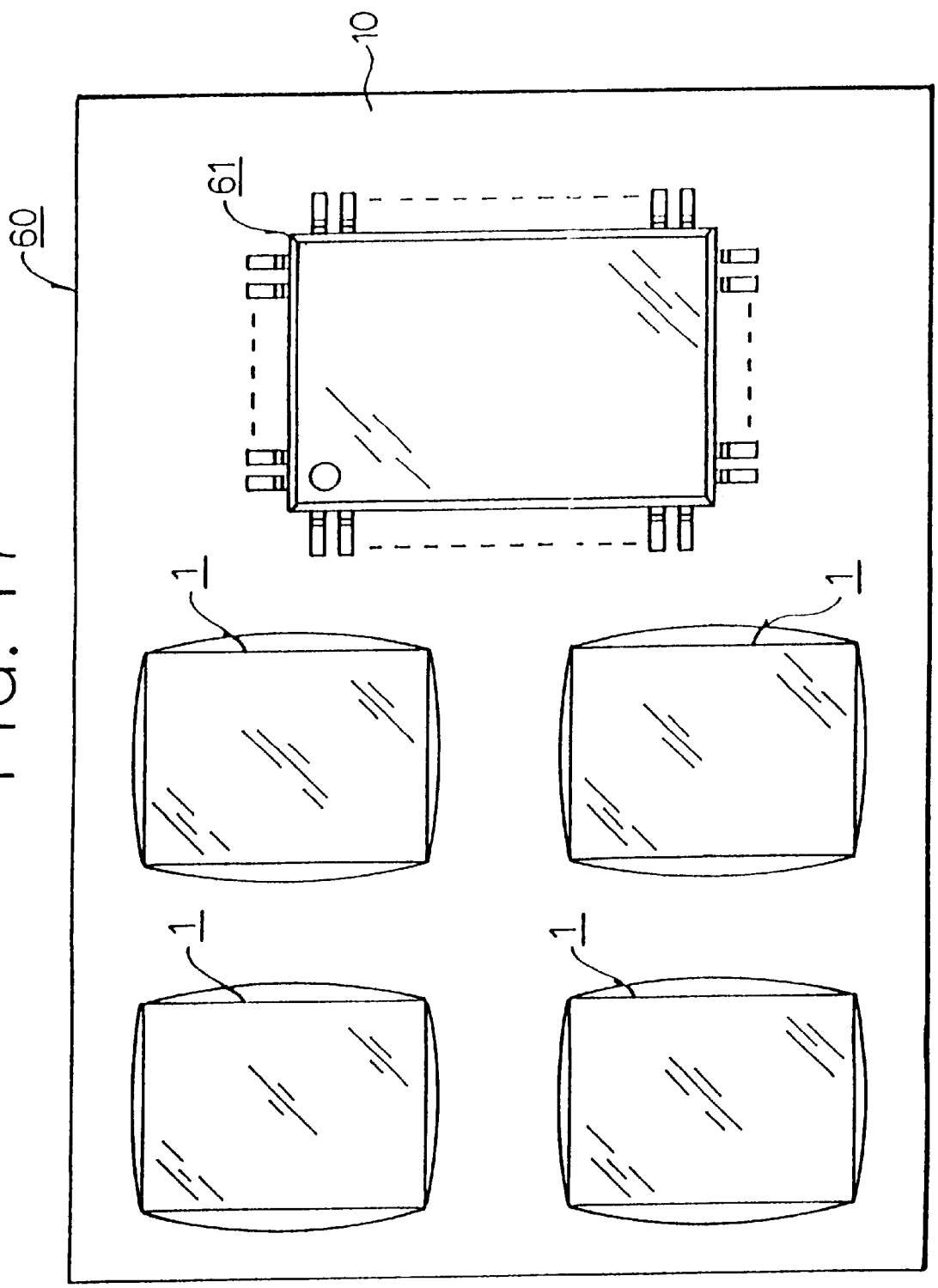
FIG. 17 is a typical plan view of a memory module (electronic device) showing an embodiment 3 of the present invention.
Figure 18:
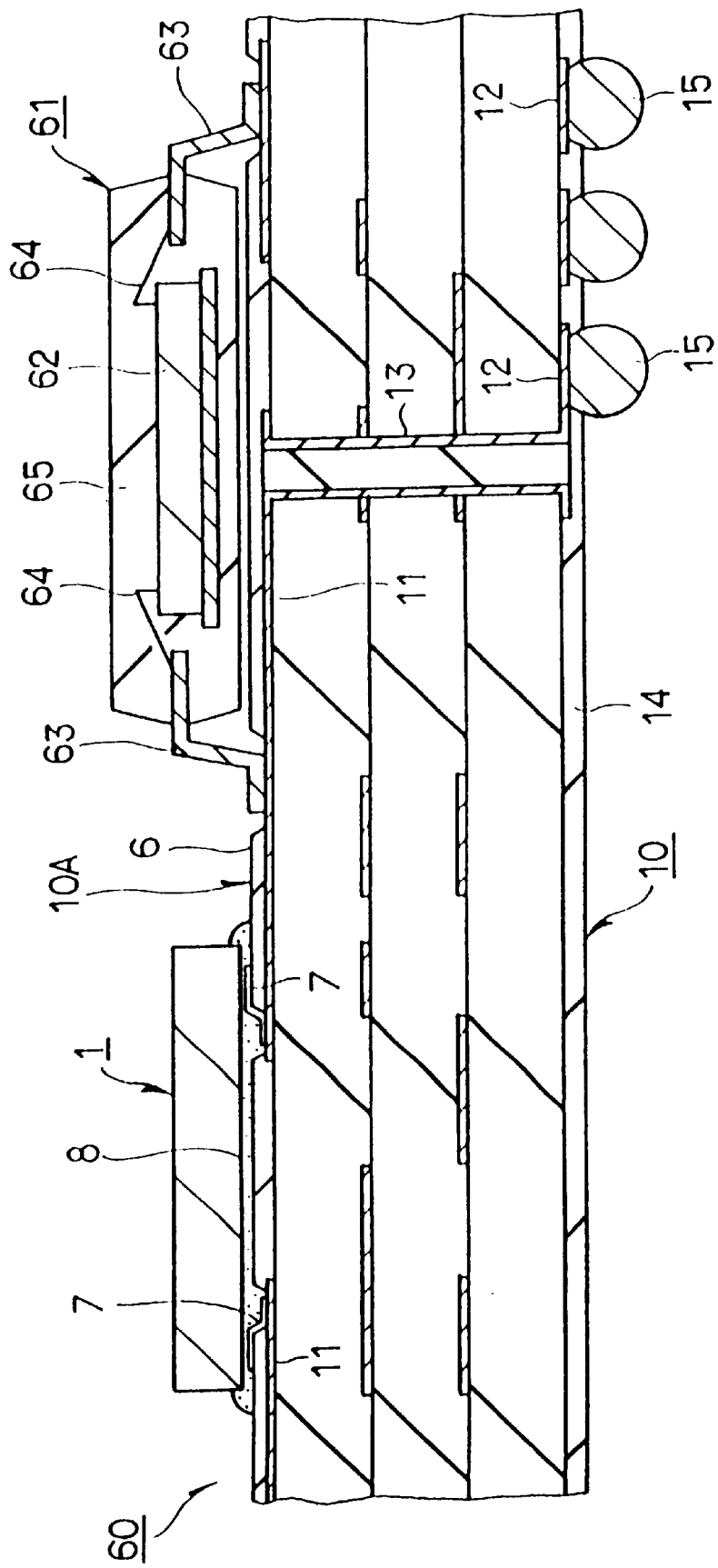
FIG. 18 is atypical cross-sectional view of the memory module showing the embodiment 3 of the present invention.

FIG. 17 is a typical plan view of a memory module showing the embodiment 3 of the present invention, and FIG. 18 is a typical cross-sectional view of the memory module.

In the memory module (electronic device) 60 according to the present embodiment, four semiconductor chips 1 and one semiconductor device 61 are implemented on one main surface 10A of a wiring board 10 as mounted parts to thereby constitute one memory system. For example, an SRAM is built in each of the four semiconductor chips 1 as a memory circuit. The one semiconductor device 61 incorporates therein a control circuit for controlling the memory circuits of the four semiconductor chips 1.

The semiconductor device 61 has a structure wherein electrode pads (bonding pads) of semiconductor chips 62 and inner portions of leads 63 are respectively electrically connected to one another by bonding wires 64, and these semiconductor chips 62, the inner portions of the leads 63, the bonding wires 64, etc. are sealed with a resin encapsulator 65. Outer portions of the leads 63 of the semiconductor device 61 are respectively electrically and mechanically connected to wirings 11 on the wiring board 10 by solder.

The wiring board 10 is basically similar in configuration to the wiring board 10 described in the aforementioned embodiments. Namely, the wiring board 10 employed in the present embodiment is configured so as to have, over one main surface 10A, wirings 11, flexible layers 6 formed so as to cover wiring portions (other portions) except for connecting portions (parts) of the wirings 11, and wirings 7 having first portions 7A electrically connected to their corresponding connecting portions 11A of the wirings 11 and second portions 7B respectively drawn onto the flexible layers 6 as shown in FIGS. 18 and 16. The semiconductor chip 1 is configured so as to have, over one main surface 1A, wirings 4 and protective films 5 formed so as to cover wiring portions (other portions) except for electrode pads (parts) 4A of the wirings 4. The semiconductor chip 1 is bonded to the wiring board 10 with an adhesive 8 interposed therebetween in a state in which one main surface 1A thereof is held face to face with one main surface 10A of the wiring board 10. The electrode pads 4A of the wirings 4 are respectively electrically connected to the second portions 7B of the wirings 7 with some (8A) of a large number of conductive particles (8A) mixed into the adhesive 8 interposed therebetween.

The production of the memory module 60 will next be explained with reference to FIG. 18.

The semiconductor chip 1, the adhesive 8 and the wiring board 10 are first prepared.

Next, a circuit forming surface 1A of the semiconductor chip 1 and one main surface 10A of the wiring board 10 are held face to face with each other and thermo-compressed in a state in which the adhesive (corresponding to an anisotropic conductive resin obtained by mixing an epoxy thermosetting resin with the large number of conductive particles 8A) 8 interposed between these, whereby the semiconductor chip 1 and the wiring board 10 are bonded and fixed to each other, and the electrode pads 4A of the wirings 4 on the semiconductor chip 1 and the second portions 7B of the wirings 7 thereon are electrically connected to one another with some 8A of the large number of conductive particles 8A interposed therebetween. Since the conductive particles 8A interposed between the protective film 5 and the flexible layer 6 on the semiconductor chip 1 are engaged in the flexible layer 6 in the present process step as shown in FIG. 16, the concentration of stress on the protective film 5 can be avoided.

Next, the semiconductor device 61 is placed on one main surface 10A of the wiring board 10. Further, the leads 63 are disposed at their corresponding connecting portions of the wirings 11 with paste-like solder interposed therebetween.

Next, heat treatment is done to melt the paste-like solder, thereby fixedly securing the wirings 11 on the wiring board 10 and the leads 63 of the semiconductor device 61 to one another.

Next, bump electrodes 15 are formed at their corresponding connecting portions of plural wirings 12 placed on the other main surface (back) of the wiring board 10 to thereby substantially complete the memory module 60.

Thus, according to the module 60 showing the present embodiment, the conductive particles 8A allow the prevention of cracks developed in the protective film 5 on the semiconductor chip 1 in a manner similar to the aforementioned embodiment 2. Since the cracks developed in the protective film 5 on the semiconductor chip 1 can be prevented by the conductive particles 8A, a high-reliable module 60 can be provided which is thinned and low in cost.

Incidentally, the present embodiment has described the example in which the flexible layers 6 and the wirings 7 are formed over one main surface 1A of the wiring board 10. However, the flexible layers 6 and the wirings 7 may be formed over the semiconductor chip 1 as in the aforementioned embodiment 1.

While the invention made by the present inventors has been described above specifically by the embodiments, the present invention is not necessarily limited to the embodiments. It is needless to say that various changes can be made thereto within the scope not departing from the substance thereof.

Advantageous effects obtained by typical ones of the inventions disclosed in the present application will be described in brief as follows:

Conductive particles allow the prevention of cracks developed in a protective film on a semiconductor chip.

A semiconductor device and an electronic device can be provided which have a high degree of reliability and are thinned and low in cost.

Industrial Applicability

As described above, a semiconductor device according to the present invention is profitable for application to a semiconductor device on which a flip chip is implemented. Further, the present semiconductor device is useful for application to portable devices such as a small memory card, a handy type personal computer, etc., and a small information communication device such as a portable cellular phone or the like, each of which makes use of the flip chip-implemented semiconductor device.

What is claimed is:

1. A semiconductor device, comprising:
   a semiconductor chip including, over one main surface thereof,
   first wirings;
   protective films formed so as to cover other portions excluding parts of said first wirings;
   flexible layers respectively formed over said protective films so as to exclude the parts of said first wirings; and
   second wirings having first portions respectively electrically connected to the parts of said first wirings, and second portions respectively drawn onto said flexible layers;
   a wiring board having third wirings over one main surface thereof; and
   an adhesive comprising a large number of conductive particles contained in an insulative resin; and
   wherein said semiconductor chip is bonded to said wiring board with the adhesive interposed therebetween in a state in which said one main surface thereof is face to face with said one main surface of said wiring board,
   the second portions of said second wirings are respectively electrically connected to the third wirings with some of the large number of conductive particles interposed therebetween, and the second portions of said second wirings are deformed by the conductive particles.

2. The semiconductor device according to claim 1, wherein said flexible layers and said second wirings respectively comprise a material more flexible than said protective films.

3. The semiconductor device according to claim 1, wherein said wiring board has fourth wirings respectively electrically connected to said third wirings over the back thereof opposite to one main surface thereof, and bump electrodes placed on the back side of said wiring board are respectively electrically connected to parts of said fourth wirings.

4. The semiconductor device according to claim 1, wherein the size of each of the large number of conductive particles is smaller than the thickness of the flexible layer on said each first wiring.

5. The semiconductor device according to claim 4, wherein said flexible layers and said second wirings respectively comprise a material more flexible than said protective films.

6. The semiconductor device according to claim 1, wherein the first portion of said each second wiring is electrically connected to the corresponding part of said each first wiring through a first opening defined in said protective film so as to expose the part of said each first wiring and a second opening defined in said flexible layer so as to overlap with the first opening, and said second opening has an open end located inside an open end of the first opening.

7. The semiconductor device according to claim 6, wherein the first portions of said first wirings are respectively bonding pads whose peripheral portions are covered with the protective films.

8. The semiconductor device according to claim 6, wherein said flexible layers and said second wirings respectively comprise a material more flexible than said protective films.

9. A semiconductor device, comprising:

a semiconductor chip including, over one main surface thereof, first wirings; and protective films formed so as to cover other portions excluding parts of said first wirings;

a wiring board including, over one main surface thereof, second wirings;

flexible layers formed so as to cover other portions excluding parts of said second wirings; and third wirings having first portions respectively electrically connected to the parts of said second wirings, and second portions respectively drawn onto said flexible layers; and an adhesive comprising a large number of conductive particles contained in an insulative substance; and wherein said semiconductor chip is bonded to said wiring board with the adhesive interposed therebetween in a state in which said one main surface thereof is face to face with said one main surface of said wiring board, the parts of said first wirings are respectively electrically connected to the second portions of said third wirings with some of the large number of conductive particles interposed therebetween, and the parts of said first wirings are deformed by the conductive particles.

10. The semiconductor device according to claim 9, wherein the size of each of the large number of conductive particles is smaller than the thickness of the flexible layer on said each second wiring and larger than the thickness of said protective film on said each first wiring.

11. The semiconductor device according to claim 10, wherein said flexible layers and said third wirings respectively comprise a material more flexible than said protective films.

12. The semiconductor device according to claim 9, wherein said flexible layers and said third wirings respectively comprise a material more flexible than said protective films.

13. The semiconductor device according to claim 9, wherein said wiring board has fourth wirings respectively electrically connected to said second wirings over a back side thereof opposite to one main surface thereof, and bump electrodes placed on the back side of said wiring board are respectively electrically connected to parts of said fourth wirings.

14. A method of manufacturing a semiconductor device, comprising the following steps:

a step for preparing a semiconductor chip including, over one main surface thereof, first wirings, protective films formed so as to cover other portions excluding parts of said first wirings, flexible layers respectively formed on said protective films so as to exclude the parts of said first wirings, and second wirings having first portions electrically connected to the parts of said first wirings and second portions respectively drawn onto said flexible layers; a wiring board having third wirings over one main surface thereof; and an adhesive comprising a large number of conductive particles contained in an insulative resin; and a step for contact-bonding said one main surface of the semiconductor chip and said one main surface of the wiring board with the adhesive interposed therebetween, allowing the semiconductor chip and the wiring board to adhere to each other, and electrically connecting the second portions of the second wirings and the third wirings to one another with some of the large number of conductive particles interposed therebetween, and in the contact-bonding step, deforming the second portions of the second wirings by the conductive particles.

15. A method of manufacturing a semiconductor device, comprising the following steps:

a step for preparing a semiconductor chip including, over one main surface thereof, first wirings and protective films formed so as to cover other portions excluding parts of said first wirings; a wiring board having, over one main surface thereof, second wirings, flexible layers formed so as to cover other portions excluding parts of said second wirings and third wirings having first portions respectively electrically connected to the parts of said second wirings, and second portions respectively drawn onto said flexible layers; and an adhesive comprising a large number of conductive particles contained in an insulative resin; and a step for contact-bonding said one main surface of the semiconductor chip and said one main surface of the wiring board with the adhesive interposed therebetween, allowing the semiconductor chip and the wiring board to adhere to each other, and electrically connecting the first portions of the first wirings and the second portions of the third wirings to one another with some of the large number of conductive particles interposed therebetween, and in the contact-bonding step, deforming the second portions of the third wirings by the conductive particles.

16. A method of manufacturing a semiconductor device, comprising the following steps:

a step for preparing a semiconductor wafer having a plurality of chip forming areas over one main surface thereof, said each chip forming area including first wirings, protective films formed so as to cover other portions excluding parts of the first wirings, flexible layers respectively formed on the protective films so as to exclude the parts of the first wirings, and second wirings having first portions respectively electrically connected to the parts of the first wirings and second portions respectively drawn onto the flexible layers, preparing a plate member having a plurality of wiring board forming areas over one main surface thereof, which include third wirings therein, and preparing an adhesive comprising a large number of conductive particles contained in an insulative resin;

a step for contact-bonding said one main surface of the semiconductor wafer and said one main surface of the plate member to each other with the adhesive interposed therebetween, allowing the semiconductor wafer and the plate member to adhere to each other, and electrically connecting the second portions of the second wirings in the chip forming areas and the third wirings in the wiring board forming areas to one another with some of the large number of conductive particles interposed therebetween, and in the contact-bonding step, deforming the second portions of the second wirings by the conductive particles; and a step for simultaneously dividing the semiconductor wafer and the plate member every said chip forming areas and said wiring board forming areas.

17. A method of manufacturing a semiconductor device, comprising the following steps:

a step for preparing a semiconductor wafer having a plurality of chip forming areas over one main surface thereof, said each individual chip forming areas including first wirings, and protective films formed so as to cover other portions excluding parts of said first wirings, preparing a plate member having a plurality of wiring board forming areas over one main surface thereof, said each individual wiring board forming areas including second wirings, flexible layers formed so as to cover other portions excluding parts of the second wirings, and third wirings having first portions respectively electrically connected to the parts of the second wirings and second portions respectively drawn onto the flexible layers, and preparing an adhesive comprising a large number of conductive particles contained in an insulative resin;

a step for contact-bonding said one main surface of the semiconductor wafer and said one main surface of the plate member to each other with the adhesive interposed therebetween, allowing the semiconductor wafer and the plate member to adhere to each other, and conductively and electrically connecting the parts of the first wirings in the chip forming areas and the second portions of the third wirings in the wiring board forming areas to one another with some of the large number of conductive particles interposed therebetween, and in the contact-bonding step, deforming the second portions of the third wirings by the conductive particles; and a step for simultaneously dividing the semiconductor wafer and the plate member every said chip forming areas and said wiring board forming areas.

18. An electronic device comprising:

a semiconductor chip including, over one main surface thereof, first wirings;

protective films formed so as to cover other portions excluding parts of said first wirings;

flexible layers respectively formed on said protective films so as to exclude the parts of said first wirings; and second wirings having first portions respectively electrically connected to the parts of said first wirings, and second portions respectively drawn onto said flexible layers;

a wiring board having third wirings over one main surface there of; and an adhesive comprising a large number of conductive particles contained in an insulative resin; and wherein said semiconductor chip is bonded to said wiring board with the adhesive interposed therebetween in a state in which said one main surface thereof is face to face with said one main surface of said wiring board, the second portions of said second wirings are respectively electrically connected to the third wirings with some of the large number of conductive particles interposed therebetween, and the second portions of said second wirings are deformed by the conductive particles.

19. An electronic device comprising:

a semiconductor chip including, over one main surface thereof, first wirings; and protective films formed so as to cover other portions excluding parts of said first wirings;

a wiring board including, over one main surface thereof, second wirings;

flexible layers formed so as to cover other portions excluding parts of said second wirings; and third wirings having first portions respectively electrically connected to the parts of said second wirings, and second portions respectively drawn onto said flexible layers; and an adhesive comprising a large number of conductive particles contained in an insulating resin; and wherein said semiconductor chip is bonded to said wiring board with the adhesive interposed therebetween in a state in which said one main surface thereof is face to face with said one main surface of said wiring board, the parts of said first wirings are respectively electrically connected to the second portions of said third wirings with some of the large number of conductive particles interposed therebetween, and the second portions of said third wirings are deformed by the conductive particles.

* * * * *